US007063935B2

(12) United States Patent
Hotta et al.

(10) Patent No.: US 7,063,935 B2
(45) Date of Patent: Jun. 20, 2006

(54) SUPPORT FOR LITHOGRAPHIC PRINTING PLATE AND PRESENSITIZED PLATE AND METHOD OF PRODUCING LITHOGRAPHIC PRINTING PLATE

(75) Inventors: Hisashi Hotta, Shizuoka (JP); Masaya Matsuki, Shizuoka (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 0 days.

(21) Appl. No.: 10/392,964

(22) Filed: Mar. 21, 2003

(65) Prior Publication Data

US 2005/0074687 A1 Apr. 7, 2005

(30) Foreign Application Priority Data

Mar. 26, 2002 (JP) ............................ 2002-086457
Mar. 29, 2002 (JP) ............................ 2002-094335

(51) Int. Cl.
*G03F 7/09* (2006.01)
*G03F 7/11* (2006.01)
*G03F 7/14* (2006.01)
*B41N 1/00* (2006.01)
*B41N 3/00* (2006.01)

(52) U.S. Cl. .............................. 430/276.1; 430/271.1; 430/272.1; 430/278.1; 430/302; 205/201; 101/453; 101/454; 101/463.1; 428/559; 428/650; 428/689

(58) Field of Classification Search ............ 430/270.1, 430/271.1, 278.1, 302, 306, 309, 434, 435, 430/494, 944, 945, 272.1, 276.1; 101/453, 101/454, 463.1; 205/201; 428/559, 650, 428/689

See application file for complete search history.

(56) References Cited

U.S. PATENT DOCUMENTS

| | | | | |
|---|---|---|---|---|
| 3,181,461 | A | 5/1965 | Fromson | |
| 4,801,527 | A | 1/1989 | Takamiya et al. | |
| 4,970,116 | A | 11/1990 | Kimura et al. | |
| 4,983,497 | A | 1/1991 | Gilson et al. | |
| 5,204,143 | A | 4/1993 | Nishimiya et al. | |
| 5,302,460 | A | 4/1994 | Pliefke et al. | |
| 6,391,522 | B1 * | 5/2002 | Nakayama et al. | 430/273.1 |
| 6,440,633 | B1 | 8/2002 | Kawauchi | |
| 6,808,864 | B1 * | 10/2004 | Sawada et al. | 430/277.1 |
| 2001/0041305 | A1 | 11/2001 | Sawada et al. | |
| 2001/0050122 | A1 | 12/2001 | Komine et al. | |

(Continued)

FOREIGN PATENT DOCUMENTS

EP 0 903 223 A1 3/1999

(Continued)

OTHER PUBLICATIONS

N. Irving Sax & Richard J. Lewis; "Hawley's Condensed Chemical Dictionary" 1987, Van Nostrand Reinhold Company, New York, XP002122301.

*Primary Examiner*—Richard L. Schilling
(74) *Attorney, Agent, or Firm*—Sughrue Mion, PLLC

(57) ABSTRACT

Disclosed is a support for a lithographic printing plate, wherein an adhering amount of a rare-earth element atom to a surface thereof is 0.1 to 20 mg/mg$^2$, and a presensitized plate provided with an image recording layer on the support for a lithographic printing plate. The presensitized plate achieving both high scum resistance and long press life can be realized, which is the same in the case the image recording layer containing an infrared absorbent, where scum would easily occur, is provided onto the support.

18 Claims, 3 Drawing Sheets

U.S. PATENT DOCUMENTS

| | | | | |
|---|---|---|---|---|
| 2003/0124364 | A1 * | 7/2003 | Sawada et al. | 428/472.2 |
| 2004/0058273 | A1 * | 3/2004 | Sasaki et al. | 430/270.1 |

FOREIGN PATENT DOCUMENTS

| | | | |
|---|---|---|---|
| EP | 1 002 644 | A2 | 5/2000 |
| EP | 1 138 792 | A1 | 10/2001 |
| EP | 1 398 172 | A1 * | 3/2004 |
| GB | 2 359 769 | A | 9/2001 |
| JP | 62-94389 | | 4/1987 |
| JP | 3-56177 | | 3/1991 |
| JP | 4-43359 | | 2/1992 |
| JP | 5-139067 | | 6/1993 |
| JP | 6-219073 | | 8/1994 |
| JP | 7-314937 | A | 12/1995 |
| JP | 10-171104 | A | 6/1998 |
| JP | 2000-37965 | | 2/2000 |
| JP | 2000-108538 | | 4/2000 |
| JP | 2000-112135 | | 4/2000 |
| JP | 2000-112136 | | 4/2000 |
| JP | 2000-190648 | | 7/2000 |
| JP | 2000-343849 | | 12/2000 |
| JP | 2001-63232 | | 3/2001 |
| JP | 2001-162958 | | 6/2001 |
| JP | 2001-264991 | | 9/2001 |
| JP | 2001-293969 | | 10/2001 |
| JP | 2001-335870 | | 12/2001 |

* cited by examiner

SUPPORT FOR LITHOGRAPHIC PRINTING PLATE AND PRESENSITIZED PLATE AND METHOD OF PRODUCING LITHOGRAPHIC PRINTING PLATE

BACKGROUND OF THE INVENTION

1. Field of the Invention

The present invention relates to a support for a lithographic printing plate and a presensitized plate. More particularly, the present invention relates to a support for a lithographic printing plate achieving both high scum resistance and long press life when processed into a lithographic printing plate, a presensitized plate using the support for a lithographic printing plate.

2. Description of the Related Art

It has been known that a hydrophilic treatment represented by a silicate treatment is performed on the surface of a lithographic printing plate after an anodizing treatment was performed thereon in order to enhance the development property of a presensitized plate. If a hydrophilic treatment is performed on the surface of a support for a lithographic printing plate, scum resistance is improved since ink which is hydrophobic is hardly adhered to non-image areas of a lithographic printing plate at the time of printing.

However, if a hydrophilic treatment is performed on the surface of a support for a lithographic printing plate, there is a case that an adhesion between an image recording layer which is hydrophobic and a support deteriorates in a presensitized plate, and press life deteriorates when processed into a lithographic printing plate.

Accordingly, a presensitized plate excellent in both scum resistance and press life when processed into a lithographic printing plate is expected.

As a countermeasure thereto, a method for improving press life is proposed by further performing a treatment on the surface of a support for a lithographic printing plate with an aqueous solution containing heavy metals such as cobalt and zirconium after a hydrophilic treatment is performed thereon (JP 7-314937 A (the term "JP XX-XXXXXX A" as used herein means an "unexamined published Japanese patent application") or the like).

With the above method, although press life is improved, scum resistance deteriorates.

In the meanwhile, scum is likely to occur during printing with a presensitized plate having an image recording layer containing an infrared absorbent such as a so-called thermal positive type image recording layer in which an infrared absorbent existent in a photosensitive layer manifests its photothermal conversion action and an exposure generates heat, whereby an exposed area in the photosensitive layer becomes alkali-soluble to form a positive image, and a so-called thermal negative type image recording layer in which its exposure-caused heat allows a radical generator or an acid forming agent to generate a radical or an acid, by which a radical polymerization reaction or an acid crosslinking reaction is accelerated and an image recording layer becomes insoluble to form a negative type image. Taken up as one of the reasons why scum is generated is that since infrared absorbents used in these image recording layers are compounds having a relative higher molecular weight, they are hardly dissolved in a developer and are likely to be adsorbed to the surface of non-image areas on a lithographic printing plate at the time of development.

Conventionally with a presensitized plate having an image recording layer containing the infrared absorbent like this, it is particularly difficult to materialize the production of a presensitized plate excellent in both the above scum resistance and press life.

In addition, in JP 10-171104 A, methods for improving scum resistance after stopping printing for a while, press life and the like are proposed (i) by performing a hydrophilic treatment with a metal silicate aqueous solution in which the mol ratio of $SiO_2/M_2O$ (M represents an alkali metal) is 0.3 to 4.0 and the concentration of an alkali metal silicate is 0.05 to 0.5 wt % before or after a treatment is performed with a carboxylate aqueous solution or (ii) by performing a hydrophilic treatment with a hydrophilic high-molecular weight compound aqueous solution after a treatment is performed with a carboxylate aqueous solution.

The methods as described in the above publication are, however, intended to improve scum resistance after stopping printing for a while, press life and the like to a so-called conventional positive type image recording layer and it can not be said that the methods are not excellent in achieving both scum resistance and press life relative to an image recording layer containing an infrared absorbent in which scum is likely to occur during printing.

SUMMARY OF THE INVENTION

Accordingly, the present invention is intended to provide a presensitized plate, particularly, a presensitized plate having an image recording layer containing an infrared absorbent, achieving both scum resistance and press life when processed into a lithographic printing plate and a support for a lithographic printing plate used therefor.

On close examination, the inventors have found that both scum resistance and press life when processed into a lithographic printing plate can be largely improved by allowing the specified amount of a rare-earth element atom to be existent on the hydrophilic surface of a support for a lithographic printing plate and completed the first aspect according to the present invention.

In addition, on close examination, the inventors have also found that both excellent scum resistance and press life when processed into a lithographic printing plate can be achieved if a support for a lithographic printing plate obtainable by the following manner that a hydrophilic treatment is performed on an aluminum plate with an alkali metal silicate aqueous solution with the concentration of 0.6 to 5.0 wt % after at least a graining treatment and an anodizing treatment are performed thereon and a treatment is further performed thereon with an aqueous solution containing a carboxylic acid and/or a carboxylate of an element in the 3rd to the 7th groups and the 13th to the 16th groups of the periodic table. The inventors have completed the second aspect according to the present invention in accordance with these findings.

Furthermore, the inventors have found that these effects are bigger if a presensitized plate has an image recording layer containing an infrared absorbent.

Namely, the present invention provides the below-mentioned (1) to (8).

(1) A support for a lithographic printing plate, wherein an adhering amount of a rare-earth element atom to a surface thereof is 0.1 to 20 $mg/m^2$ (first aspect according to the present invention).

(2) The support for a lithographic printing plate according to the above (1) obtainable by a hydrophilic treatment and a treatment with a liquid containing a rare-earth element ion are performed by sequentially on an aluminum plate after at least an anodizing treatment is performed thereon.

(3) The support for a lithographic printing plate according to the above (2), wherein the hydrophilic treatment is a treatment with an alkali metal silicate aqueous solution.

(4) A support for a lithographic printing plate obtainable by a following manner that a hydrophilic treatment is performed on an aluminum plate with an alkali metal silicate aqueous solution with a concentration of 0.6 to 5.0 wt % after at least a graining treatment and an anodizing treatment are performed thereon and a treatment is further performed thereon with an aqueous solution containing a carboxylic acid and/or a carboxylate of an element in the third to the 7th groups and the 13th to the 16th groups of the periodic table (second aspect according to the present invention).

Herein, a support for a lithographic printing plate corresponding to any of the first aspect or the second aspect according to the present invention is taken up as a suitable aspect. Namely, one of the suitable aspects according to the present invention is a support for a lithographic printing plate obtainable by the following manner that a hydrophilic treatment is performed on an aluminum plate with an alkali metal silicate aqueous solution with a concentration of 0.6 to 5.0 wt % after at least a graining treatment and an anodizing treatment are performed thereon and a treatment is further performed thereon with an aqueous solution containing a carboxylic acid and/or a carboxylate of an element in the 3rd to the 7th groups and the 13th to the 16th groups of the periodic table, wherein an adhering amount of a rare-earth element atom to a surface thereof is 0.1 to 20 $mg/m^2$. An aqueous solution containing a carboxylate of a rare-earth element is preferably taken up as the concrete aqueous solution containing a carboxylic acid and/or a carboxylate of an element in the 3rd to the 7th groups and the 13th to the 16th groups of the periodic table.

(5) A presensitized plate provided with an image recording layer on the support for a lithographic printing plate according to any one of the above (1) to (4).

(6) The presensitized plate according to the above (5), wherein the image recording layer is an image recording layer containing an infrared absorbent.

(7) The presensitized plate according to the above (5) or (6), wherein there is provided an intermediate layer containing a high-molecular compound having a constituent with an acid group and a constituent with an onium group between the support for a lithographic printing plate and the image recording layer.

(8) A method for producing a lithographic printing plate by performing a development using a developer containing substantially no alkali metal silicates after an exposure is performed on the presensitized plate according to any one of the above (5) to (7) to obtain a lithographic printing plate.

It is considered that the reason why a presensitized plate using a support for a lithographic printing plate according to the present invention can achieve both scum resistance and press life when processed into a lithographic printing plate is as follows.

With a support for a lithographic printing plate in the first aspect according to the present invention, by adhering the specified amount of a rare-earth element atom to a hydrophilic surface, an area to which the rare-earth element atom is adhered (a part of the hydrophilic surface) becomes hydrophobic, thereby an adhesion between an image recording layer and a support is promoted and excellent press life when processed into a lithographic printing plate is thus achieved.

On the other hand, since the rare-earth element atom existent on the hydrophilic surface is removed by allowing a developer to dissolve it in a development, the entire surface of non-image areas on a lithographic printing plate becomes hydrophilic and scum resistance is thus accelerated.

In addition, if a presensitized plate according to the present invention has an intermediate layer containing a high-molecular compound having a constituent with an acid group and a constituent with onium group between the support for a lithographic printing plate and the image recording layer, press life is significantly improved.

Since onium group existent in the intermediate layer is positively-charged and electrostatic interactions are thus each generated between the onium group and a negatively-charged area on a hydrophilic surface in the support on which a hydrophilic treatment such as a silicate treatment is performed, and between the onium group and a negatively-charged or polarized area in the image recording layer (for example, functional groups which are negatively polarized such as hydroxy group, carboxy group and sulfonyl group contained in compounds which are comprised in an image recording layer (concretely for example, phenolic hydroxy group in case an image recording layer contains novolak resin)), an adhesion between the image recording layer and the support is improved through the intermediate layer, leading to the improvement of press life.

In addition, electrostatic interactions are generated both between an acid group existent in the intermediate layer and an area in which a rare-earth element atom is existent out of the hydrophilic surface to which a rare-earth element atom is adhered and between the acid group and an area in which no hydrophilic compound is existent and an anodized layer is exposed out of the hydrophilic surface to which a rare-earth element atom is adhered. Particularly, electrostatic interactions are generated between the acid group and the area in which an anodized layer is exposed, press life which is deteriorated by the hydrophilic treatment is improved.

As described above, if the presensitized plate according to the present invention has the above intermediate layer, press life is extremely excellent. Particularly, if the image recording layer in the presensitized plate has novolak resin, an area of the image recording layer which is negatively charged is increased, it is preferred as the above electrostatic interactions become bigger.

As described below, if the support for a lithographic printing plate of the present invention is used, a presensitized plate achieving both high scum resistance and long press life can be realized, which is the same in the case the image recording layer containing an infrared absorbent, where scum would easily occur, is provided onto the support.

DETAILED DESCRIPTION

Figure 1:
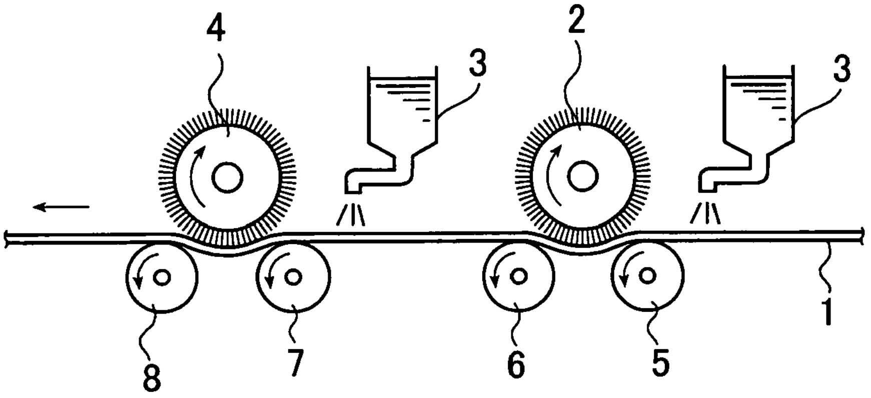
FIG. 1 is a side view showing a concept of a brush graining process used for a mechanical graining treatment used in production of a support for a lithographic printing plate according to the present invention.

Hereafter, the present invention will be explained in detail.

[Support for Lithographic Printing Plate]

<Surface Treatment>

In the support for a lithographic printing plate in the first aspect according to the present invention, a grained shape is preferably formed on a surface of an aluminum plate described later by performing a surface treatment on the aluminum plate described later. Although a support for a lithographic printing plate in the first aspect according to the present invention is preferably obtained by sequentially performing a hydrophilic treatment and a treatment with a liquid containing a rare-earth element ion on the aluminum plate after performing at least an anodizing treatment thereon, the production process of this support is not particularly limited and various processes other than the above treatments may be included.

In addition, in the support for a lithographic printing plate in the second aspect according to the present invention, a grained surface is formed on a surface of an aluminum plate by performing a surface treatment on the aluminum plate described later. Although a support for a lithographic printing plate in the second aspect according to the present invention is obtained by performing a hydrophilic treatment on the aluminum plate with an alkali metal silicate aqueous solution with the concentration of 0.6 to 5.0 wt % after performing at least a graining treatment and an anodizing treatment thereon and further performing a treatment with an aqueous solution containing a carboxylic acid and/or a carboxylate of an element in the 3rd to the 7th groups and the 13th to the 16th groups of the periodic table, the production process of this support is not particularly limited and various processes other than the above treatments may be also included.

As typical methods of forming a grain shape on a surface, the following methods will be explained:

a method by sequentially performing a mechanical graining treatment, an alkali etching treatment, a desmutting treatment with an acid, and an electrochemical graining treatment with an electrolyte on an aluminum plate;

a method by performing, for several times, a mechanical graining treatment, an alkali etching treatment, a desmutting treatment with an acid, and an electrochemical graining treatment with an electrolyte on an aluminum plate;

a method by sequentially performing an alkali etching treatment, a desmutting treatment with an acid, and an electrochemical graining treatment with an electrolyte on an aluminum plate; and a method by performing, for several times, an alkali etching treatment, a desmutting treatment with an acid, and an electrochemical graining treatment with an electrolyte on an aluminum plate. However, according to the present invention, the method is not limited to the above. In these methods, an alkali etching treatment and a desmutting treatment may be further performed after the electrochemical graining treatment as above is performed.

According to the present invention, one of particularly preferable methods is a method by sequentially performing, on an aluminum plate, a mechanical graining treatment, an alkali etching treatment, a desmutting treatment with an acid, an electrochemical graining treatment with an electrolyte containing nitric acid, an alkali etching treatment, a desmutting treatment with an acid, an electrochemical graining treatment with an electrolyte containing hydrochloric acid, an alkali etching treatment, and a desmutting treatment with an acid.

Hereafter, each process of the surface treatment will be explained in detail.

<Mechanical Graining Treatment>

Mechanical graining treatment is effective means for graining treatment since it is capable of forming a surface with average wavelength 5 to 100 μm asperities at a lower cost than electrochemical graining treatment.

Mechanical graining treatment that can be used includes wire brush graining treatment by scratching an aluminum plate surface with metal wire, ball graining treatment by performing graining on an aluminum plate surface with an abrasive ball and an abrasive agent, and brush graining treatment by performing graining on a surface with a nylon brush and an abrasive agent as described in JP 6-135175 A and JP 50-40047 B (the term "JP XX-XXXXXX B" as used herein means an "examined Japanese patent publication").

In addition, a transfer method in which a surface with asperities is pressed onto an aluminum plate can be also employed. That is, applicable methods include those described in JP 55-74898 A, JP 60-36195 A and JP 60-203496 A, as well as a method described in JP 6-55871 A characterized by performing transfer several times, and a method described in JP 6-024168 A characterized in that the surface is elastic.

It is also possible to use a method by repeatedly performing transfer using a transfer roller on which fine asperities are etched with electric discharge machining, shot blast, laser, plasma etching or the like, and a method in which a surface with asperities on which fine particles are applied is allowed to contact with an aluminum plate, pressure is applied on that several times, and transfer of the asperity pattern equivalent to average diameter of fine particles is repeatedly performed on an aluminum plate several times. A method of providing fine asperities to a transfer roll includes methods known to the public, as described in JP 3-8635 A, JP 3-66404 A, JP 63-65017 A or the like. In addition, fine grooves may be engraved on the surface of the transfer roll from two directions with a dice, a turning tool, a laser or the like to form square asperities on the surface. Also, publicly known etching treatment or the like may be performed on the surface of the transfer roll such that the formed square asperities become round.

In addition, hardening, hard chrome plating or the like may be performed to increase hardness of a surface.

Moreover, mechanical graining treatment may include methods as described in JP 61-162351 A, JP 63-104889 A or the like.

In the present invention, each method as above may be used in combination with others, taking productivity or the like into consideration. It is preferable that these mechanical graining treatments are performed before electrochemical graining treatment.

Hereafter, brush graining treatment preferably used as mechanical graining treatment will be explained.

Brush graining treatment generally uses a roller-like brush in which a lot of synthetic resin brushes made of synthetic resin such as nylon (trademark), polypropylene and PVC resin are implanted on the surface of a cylindrical drum, and treatment is performed by scrubbing one or both of the surfaces of the aluminum plate while spraying a slurry containing an abrasive over a rotating roller-like brush. An abrasive roller on which an abrasive layer is provided may be also used in place of the roller-like brush and a slurry.

When a roller-like brush is used, bending elastic modulus is preferably 10,000 to 40,000 $kg/cm^2$, more preferably 15,000 to 35,000 $kg/cm^2$, and a treatment should use a brush with bristle elasticity of, preferably 500 g or less, more preferably 400 g or less. The diameter of the bristle is generally 0.2 to 0.9 mm. While the length of the bristle can be appropriately determined depending on the outer diameter of the roller-like brush and the diameter of the drum, it is generally 10 to 100 mm.

As to an abrasive, a publicly known one may be used. Abrasives that can be used include pumice, silica sand, aluminum hydroxide, alumina powder, silicon carbide, silicon nitride, volcanic ash, carborundum, emery, and mixtures thereof. Pumice and silica sand are preferable among them. Silica sand is particularly preferable because of excellent graining efficiency since it is harder than pumice and is not easily broken compared to pumice.

A preferable average particle diameter of the abrasive is 3 to 50 μm, and more preferably 6 to 45 μm, from the viewpoint of excellent graining efficiency and that graining pitch can be narrowed.

An abrasive is, for example, suspended in water and used as a slurry. Beside abrasives, thickener, dispersant (for example, surfactant), antiseptic agent or the like may be contained in the slurry. It is preferable that the specific gravity of a slurry is 0.5 to 2.

As an apparatus suitable for mechanical graining treatment, for example, includes an apparatus as described in JP 50-40047 B.

<Electrochemical Graining Treatment>

Electrochemical graining treatment (hereinafter referred also to as "electrolytic graining treatment") may use an electrolyte used for electrochemical graining treatment with an ordinary alternating current. Particularly, it is preferable to use an electrolyte mainly composed of hydrochloric acid or nitric acid.

As electrolytic graining according to the present invention, it is preferable that the first and second electrolytic treatments are performed in an acid solution in alternating corrugated current before and after the cathode electrolytic treatment. Hydrogen gas is generated on the surface of an aluminum plate to produce smut by cathode electrolytic treatment, thereby creating an even surface condition. This allows the even graining treatment to be performed at the time of electrolytic treatment by the subsequent alternating corrugated current.

This electrolytic graining treatment can follow the electrochemical graining treatment (electrolytic graining treatment) as described in JP 48-28123 B and GB 896,563, for example. Although this electrolytic graining treatment uses sine waveform alternating current, a special waveform may be used as described in JP 52-58602 A. In addition, a waveform as described in JP 3-79799 A can be also used. Moreover, the methods as described in JP 55-158298 A, JP 56-28898 A, JP 52-58602 A, JP 52-152302 A, JP 54-85802 A, JP 60-190392 A, JP 58-120531 A, JP 63-176187 A, JP 1-5889 A, JP 1-280590 A, JP 1-118489 A, JP 1-148592 A, JP 1-178496 A, JP 1-188315 A, JP 1-154797 A, JP 2-235794 A, JP 3-260100 A, JP 3-253600 A, JP 4-72079 A, JP 4-72098 A, JP 3-267400 A and JP 1-141094 A may also be used. In addition, besides the aforementioned, it is also possible to perform electrolysis using a special frequency alternating current proposed as a method for producing an electrolytic capacitor. It is described for example in U.S. Pat. No. 4,276,129 and U.S. Pat. No. 4,676,879.

While an electrolytic bath and power supply are variously proposed, those as described in U.S. Pat. No. 4,203,637, JP 56-123400 A, JP 57-59770 A, JP 53-12738 A, JP 53-32821 A, JP 53-32822 A, JP 53-32823 A, JP 55-122896 A, JP 55-132884 A, JP 62-127500 A, JP 1-52100 A, JP 1-52098 A, JP 60-67700 A, JP 1-230800 A, JP 3-257199 A or the like can be used.

In addition, those as described in JP 52-58602 A, JP 52-152302 A, JP 53-12738 A, JP 53-12739 A, JP 53-32821 A, JP 53-32822 A, JP 53-32833 A, JP 53-32824 A, JP 53-32825 A, JP 54-85802 A, JP 55-122896 A, JP 55-132884 A, JP 48-28123 B, JP 51-7081 B, JP 52-133838 A, JP 52-133840 A, JP 52-133844 A, JP 52-133845 A, JP 53-149135 A, JP 54-146234 A or the like can be used.

As an acid solution that is an electrolyte, in addition to nitric acid and hydrochloric acid, the electrolytes as described in U.S. Pat. No. 4,671,859, U.S. Pat. No. 4,661,219, U.S. Pat. No. 4,618,405, U.S. Pat. No. 4,600,482, U.S. Pat. No. 4,566,960, U.S. Pat. No. 4,566,958, U.S. Pat. No. 4,566,959, U.S. Pat. No. 4,416,972, U.S. Pat. No. 4,374,710, U.S. Pat. No. 4,336,113 and U.S. Pat. No. 4,184,932 or the like can be used.

The concentration of an acid solution should preferably be 0.01 to 2.5 wt %, and it should be particularly preferably 0.05 to 1.0 wt %, taking the use for desmutting treatment into account. In addition, the temperature of a solution should preferably be 20 to 80° C., and should more preferably be 30 to 60° C.

An aqueous solution mainly composed of hydrochloric acid or nitric acid can be used in such a manner that at least one of nitrates having nitrate ion such as aluminum nitrate, sodium nitrate and ammonium nitrate or chlorides having chlorine ion such as aluminum chloride, sodium chloride and ammonium chloride is added in a range from 1 g/L to a saturation point to hydrochloric acid or nitric acid aqueous solution of the concentration 1 to 100 g/L. In addition, metals contained in aluminum alloys such as iron, copper, manganese, nickel, titanium, magnesium and silicon may be dissolved in the aqueous solution mainly composed of hydrochloric acid or nitric acid. It is preferable that a solution in which aluminum chloride, aluminum nitrate and the like are added to an aqueous solution containing hydrochloric acid or nitric acid of the concentration of 0.01 to 2.5 wt % so as to allow aluminum ion of 3 to 50 g/L to be contained is used.

In addition, it is possible to perform the even graining also on an aluminum plate containing a large amount of copper by adding a compound capable of forming a complex with copper and using it. Compounds capable of forming a complex with copper include ammonia; amines obtained by substituting hydrogen atom in ammonia by hydrocarbon group (aliphatic and aromatic, or the like) or the like, such as methylamine, ethylamine, dimethylamine, diethylamine, trimethylamine, cyclohexylamine, triethanolamine, triisopropanolamine, EDTA (ethylenediaminetetraacetic acid); metal carbonates such as sodium carbonate, potassium carbonate and potassium hydrogencarbonate. Ammonium salts such as ammonium nitrate, ammonium chloride, ammonium sulfate, ammonium phosphate and ammonium carbonate are also included.

The temperature should preferably be 10 to 60° C., and should more preferably be 20 to 50° C.

Figure 2:
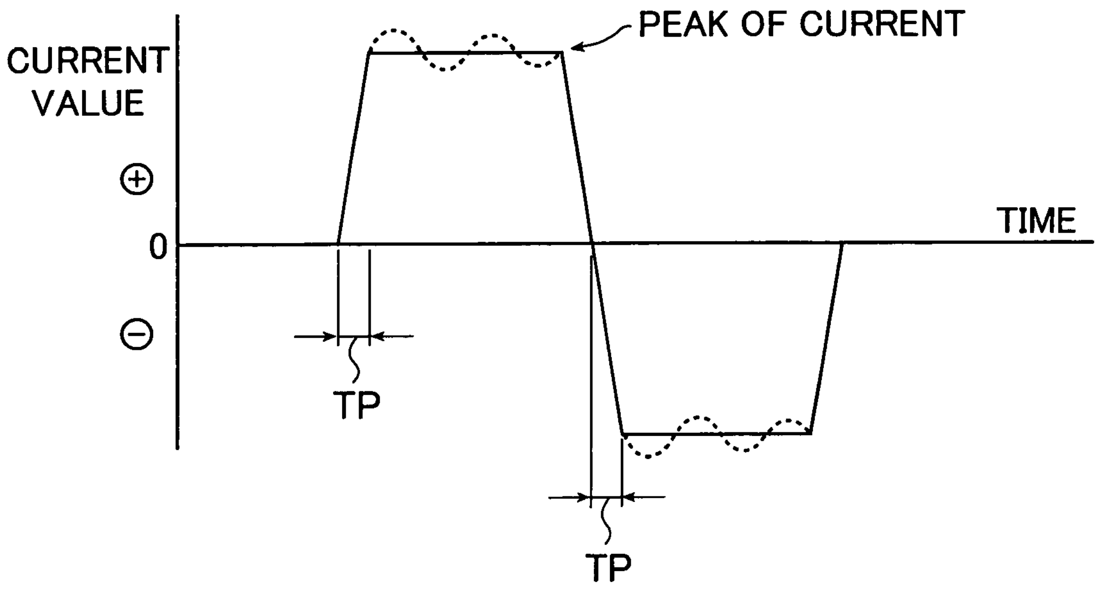
FIG. 2 is a graph showing an example of a trapezoidal current waveform view used for an electrochemical graining treatment used in production of a support for a lithographic printing plate according to the present invention.

Alternating current power supply wave used for electrochemical graining treatment is not particularly limited and sine wave, square wave, trapezoidal wave, triangle wave or the like are used. Square wave or trapezoidal wave is preferable, and trapezoidal wave is particularly preferable. Trapezoidal wave is one as shown in FIG. 2. It is preferable that with this trapezoidal wave, a time required for the current to reach a peak from zero (TP) is 1 to 3 msec. If it is less than 1 msec, non-uniformity in treatment called chatter mark is easily generated in a direction perpendicular to a traveling direction of an aluminum plate. If TP exceeds 3 msec, particularly when nitric acid electrolyte is used, an aluminum plate is easily affected by trace components in an electrolyte represented by ammonium ion or the like that spontaneously increase in electrochemical graining treatment, thus the even graining is not easily performed. As a result, scum resistance is likely to deteriorate when a lithographic printing plate is prepared.

Trapezoidal wave alternating current with a duty ratio of 1:2 to 2:1 is usable, and duty ratio should preferably be 1:1 in an indirect power supplying system dispensing with a conductor roll for aluminum as described in JP 5-195300 A.

While trapezoidal wave alternating current with a frequency of 0.1 to 120 Hz is usable, frequency should preferably be 50 to 70 Hz in terms of equipment. If it is lower than 50 Hz, the carbon electrode of a main electrode is easily dissolved, and if it is higher than 70 Hz, it is easily affected by the components of inductance in a power supply circuit, thus an electric power cost increases.

Figure 3:
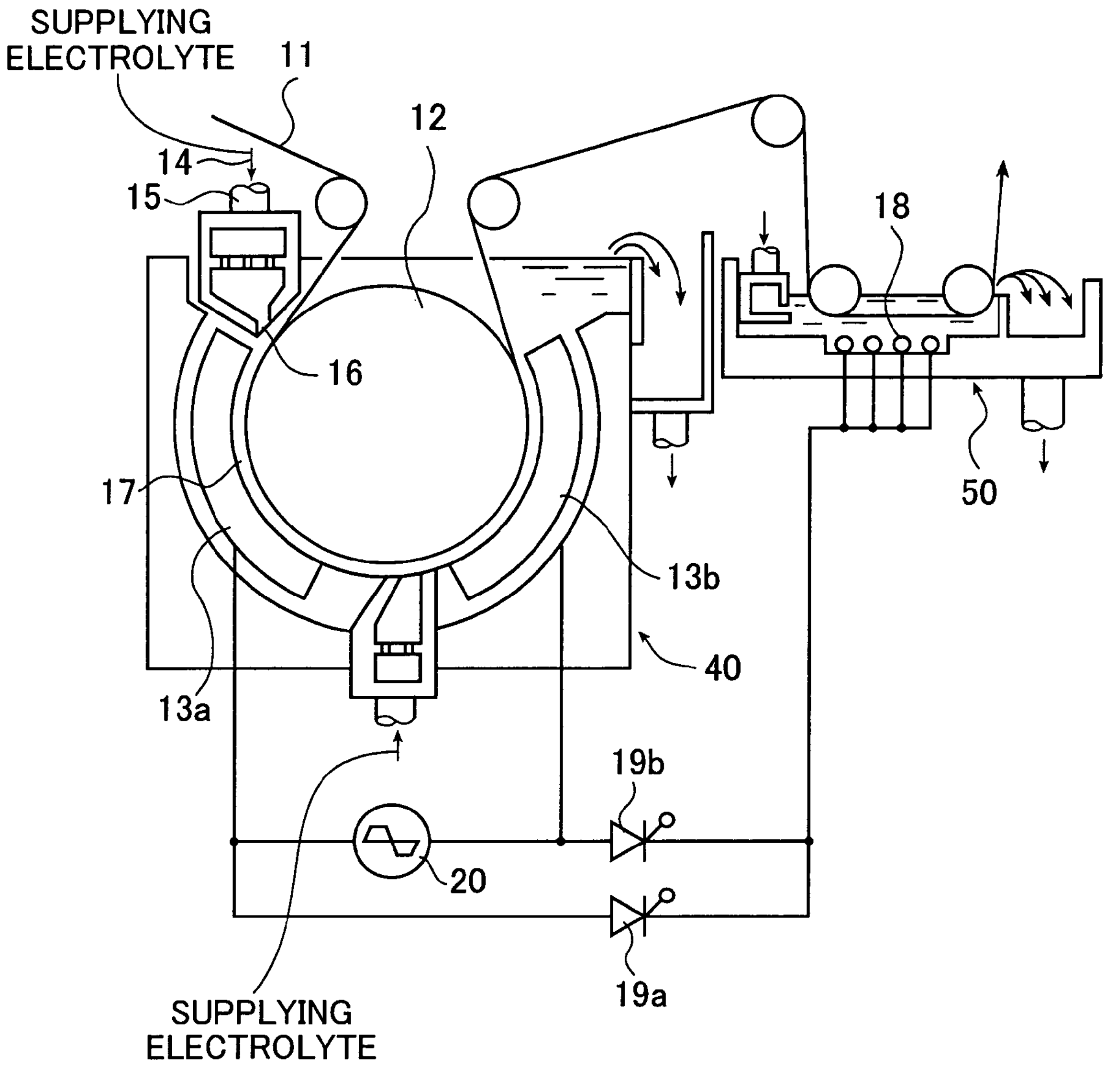
FIG. 3 is a side view showing an example of a radial cell used for an electrochemical graining treatment using alternating current used in production of a support for a lithographic printing plate according to the present invention.

One or more alternating current power supplies can be connected to an electrolytic bath. It is preferable that, as shown in FIG. 3, an auxiliary anode is installed and a part of alternating current is shunted, for the purpose of controlling the current ratio at the anode and the cathode of alternating current applied to an aluminum plate opposite to the main electrode so as to perform the even graining and dissolve carbon in the main electrode. In FIG. 3, a reference numeral 11 denotes an aluminum plate, 12 denotes a radial drum roller, 13*a* and 13*b* denote main electrodes, 14 denotes an electrolyte, 15 denotes an electrolyte feed port, 16 denotes a slit, 17 denotes an electrolyte path, 18 denotes an auxiliary anode, 19*a* and 19*b* denote thyristors, 20 denotes an alternating current power supply, 40 denotes a main electrolytic bath, and 50 denotes an auxiliary anodizing bath. By shunting a part of a current value to an auxiliary anode provided in a bath different from the two main electrode baths in the two main electrodes as direct current via a rectifying device or a switching device, the ratio of a current value used for an anodizing reaction with respect to a current value used for a cathodic reaction reacting on the aluminum plate opposite to the main electrode can be controlled. It is preferable that the ratio of amount of electricity (amount of electricity at cathode/amount of electricity at anode) used for an anodizing reaction and a cathodic reaction on the aluminum plate opposite to the main electrode is 0.3 to 0.95.

While an electrolytic bath used for a publicly known surface treatment such as a vertical type, a flat type and a radial type is usable, a radial type electrolytic bath as described in JP 5-195300 A is particularly preferable. The direction of travel of an electrolyte which passes through the electrolytic bath may be parallel with or perpendicular to that of an aluminum web.

(Electrolysis With Nitric Acid)

A pit with average aperture diameter of 0.5 to 5 μm can be formed by performing electrochemical graining treatment using an electrolyte mainly composed of nitric acid. If amount of electricity is, however, relatively large, an electrolytic reaction concentrates to produce a honeycomb pit with an aperture diameter of even more than 5 μm.

In order to obtain graining like this, the total amount of electricity used for the anodizing reaction of the aluminum plate at a time when an electrolytic reaction is completed should preferably be 1 to 1,000 $C/dm^2$, and should more preferably be 50 to 300 $C/dm^2$. It is preferable that current density is 20 to 100 $A/dm^2$ in this case.

If an electrolyte containing nitric acid of a high concentration or a high temperature is used, a grained structure with small undulation of average aperture diameter of 0.2 μm or less can be also formed.

(Electrolysis With Hydrochloric Acid)

Since hydrochloric acid per se has a strong aluminum solvency, it is possible to form micro asperities on its surface by merely applying a little electrolysis thereon. These micro asperities are of average aperture diameter 0.01 to 0.2 μm and are evenly formed on the entire surface of the aluminum plate. In order to obtain graining like this, the total amount of electricity used for the anodizing reaction of an aluminum plate at a time when an electrolytic reaction is completed should preferably be 1 to 100 $C/dm^2$, more preferably be 20 to 70 $C/dm^2$. It is preferable that current density is 20 to 50 $A/dm^2$ in this case.

It is also possible to simultaneously form a crater-like large undulation by increasing the total amount of electricity used for an anodizing reaction to 400 to 1,000 $C/dm^2$ in electrochemical graining treatment with an electrolyte mainly composed of hydrochloric acid like this. In this case, micro asperities of average aperture diameter 0.01 to 0.4 μm are formed on the entire surface, being superimposed on a crater-like large undulation of average aperture diameter 10 to 30 μm.

It is preferable that in the present invention, electrolytic graining treatment with an electrolyte mainly composed of nitric acid (electrolysis with nitric acid) as mentioned above is performed as the first electrolytic graining treatment, and electrolytic graining treatment with an electrolyte mainly composed of hydrochloric acid (electrolysis with hydrochloric acid) as mentioned above is performed as the second electrochemical graining treatment.

It is preferable that cathode electrolytic treatment is performed on the aluminum plate between the first and the second electrolytic graining treatments in electrolyte containing nitric acid, hydrochloric acid or the like, as mentioned above. This cathode electrolytic treatment allows smut to be produced on the surface of the aluminum plate and hydrogen gas to be generated, and thus electrolytic graining treatment can be more evenly performed. This cathodic electrolytic treatment is performed with cathodic amount of electricity preferably 3 to 80 $C/dm^2$ in an acid solution, and more preferably 5 to 30 $C/dm^2$. If cathodic amount of electricity is less than 3 $C/dm^2$, an amount of attached smut may be insufficient, and if it exceeds 80 $C/dm^2$, an amount of attached smut may be too excessive. Both cases are not preferable. In addition, the cathodic electrolytic treatment may use the same electrolytes used for the first and second electrolytic graining treatments, or a different electrolyte.

<Alkali Etching Treatment>

Alkali etching treatment is a treatment that dissolves a surface layer of the aforementioned aluminum plate by allowing the aluminum plate to contact with an alkali solution.

Alkali etching treatment performed before electrolytic graining treatment is performed to remove rolling oil, dirt, naturally oxidized layer or the like on the surface of the aluminum plate (rolled aluminum) if mechanical graining treatment is not performed thereon, and is performed to dissolve edge portions of asperities generated by mechanical graining treatment to change steeper asperities on the surface to a smoother surge surface if mechanical graining treatment has been already performed.

If mechanical graining treatment is not performed before alkali etching treatment, an amount of etching should preferably be 0.1 to 10 $g/m^2$, and more preferably be 1 to 5 $g/m^2$. If an amount of etching is less than 0.1 $g/m^2$, pits can not be formed evenly to produce non-uniformity in electrolytic graining treatment to be performed later since rolling oil, dirt, naturally oxidized layer or the like may be left on the surface of a plate. On the other hand, if an amount of etching is 1 to 10 $g/m^2$, rolling oil, dirt, naturally oxidized layer and the like are fully removed from the surface of a plate. If an amount of etching exceeds that range, it is less economical.

If mechanical graining treatment is performed before alkali etching treatment, an amount of etching should preferably be 3 to 20 $g/m^2$, and more preferably be 5 to 15 $g/m^2$. If an amount of etching is less than 3 $g/m^2$, the asperities formed by mechanical graining treatment or the like may not be sometimes smoothed, and pits can not be evenly formed in electrolytic treatment to be performed later. In addition, dirt may deteriorate during printing. On the other hand, if an amount of etching exceeds 20 $g/m^2$, asperities structure will disappear.

Alkali etching treatment just after electrolytic graining treatment is performed to dissolve smut produced in an acid electrolyte and to dissolve edge portions of pits formed by electrolytic graining treatment.

An optimum amount of etching varies since a pit formed by electrolytic graining treatment varies according to the kind of an electrolyte. However, it is preferable that an amount of etching in alkali etching treatment after electrolytic graining treatment is 0.1 to 5 $g/m^2$. If a nitric acid electrolyte is used, it is necessary to set an amount of etching to a greater amount than that of the case a hydrochloric acid electrolyte is used.

If electrolytic graining treatment is performed several times, alkali etching treatment can be performed after each electrolytic graining treatment as required.

Alkali used for an alkali solution includes, for example, caustic alkali and alkali metal salts. More specifically, it includes sodium hydroxide and potassium hydroxide. In addition, it includes silicates of alkali metals such as sodium metasilicate, sodium silicate, potassium metasilicate, potassium silicate; carbonates of alkali metals such as sodium carbonate and potassium carbonate; aluminates of alkali metals such as sodium aluminate and potassium aluminate; aldonates of alkali metals such as sodium gluconates and potassium gluconates; hydrogenphosphates of alkali metals such as disodium hydrogen phosphate, dipotassium hydrogen phosphate, sodium dihydrogenphosphate and potassium dihydrogenphosphate. Among them a caustic alkali solution and a solution containing both a caustic alkali and aluminate of alkali metal are preferable from a viewpoint that the rate of etching is fast and costs are lower. Particularly, an aqueous solution of sodium hydroxide is preferable.

The concentration of an alkali solution can be determined in accordance with an amount of etching, and it should preferably be 1 to 50 wt %, more preferably be 10 to 35 wt %. If aluminum ion is dissolved in an alkali aqueous solution, the concentration of aluminum ion should preferably be 0.01 to 10 wt %, more preferably be 3 to 8 wt %. It is preferable that the temperature of an alkali aqueous solution is 20 to 90° C., and treatment time is 1 to 120 seconds.

Methods of allowing an aluminum plate to contact with an alkali solution include, for example, a method by allowing an aluminum plate to pass through a bath containing an alkali solution, a method by allowing an aluminum plate to be immersed in a bath containing an alkali solution, and a method by spraying an alkali solution over the surface of an aluminum plate.

<Desmutting Treatment>

After electrolytic graining treatment or alkali etching treatment is performed, pickling (desmutting treatment) is performed to remove dirt (smut) left on the surface of a plate. Acids that are used include nitric acid, sulfuric acid, phosphoric acid, chromic acid, hydrofluoric acid, borofluoric acid or the like.

The desmutting treatment is performed by allowing the aluminum plate to contact with an acid solution of concentration 0.5 to 30 wt % of hydrochloric acid, nitric acid, sulfuric acid or the like (aluminum ion 0.01 to 5 wt % contained). A method of allowing an aluminum plate to contact with an acid solution include, for example, a method by allowing an aluminum plate to pass through a bath containing an acid solution, a method by allowing an aluminum plate to be immersed in a bath containing an acid solution, and a method by spraying an acid solution over the surface of an aluminum plate.

In desmutting treatment, an acid solution that can be used includes a wastewater of an aqueous solution mainly containing nitric acid or an aqueous solution mainly containing hydrochloric acid discharged in the electrolytic treatment described above, or a wastewater of an aqueous solution mainly containing sulfuric acid discharged in anodizing treatment described later.

It is preferable that a liquid temperature of desmutting is 25 to 90° C. It is preferable that a treatment time is 1 to 180 seconds. Aluminum and aluminum alloy components may be dissolved in an acid solution used for desmutting treatment.

<Anodizing Treatment>

Anodizing treatment is further performed on the aluminum plate processed as above. Anodizing treatment can be performed in the same method as in a method conventionally performed in this field of technology. For example, if current is allowed to flow in the aluminum plate as an anode in a solution containing sulfuric acid of the concentration of 50 to 300 g/L and aluminum of the concentration of 5 wt % or less, an anodized layer can be formed on the surface of the aluminum plate. A single or two or more kinds of sulfuric acid, phosphoric acid, chromic acid, oxalic acid, sulfamic acid, benzenesulfonic acid or the like can be used for a solution for the anodizing treatment.

In this case, components normally contained in an aluminum plate, an electrode, city water, an underground water or the like may be contained in an electrolyte. A second and a third components may be further added thereto. The second and third components for example may include metal ions such as Na, K, Mg, Li, Ca, Ti, Al, V, Cr, Mn, Fe, Co, Ni, Cu and Zn; cation such as ammonium ion; anion such as nitrate ion, carbonate ion, chloride ion, phosphate ion, fluoride ion, sulfite ion, titanate ion, silicate ion and borate ion. Each of them may be contained in the concentration of approximately 0 to 10,000 ppm in an electrolyte.

Although the conditions of anodizing treatment can not be indiscriminately determined since they are variously changed according to an electrolyte to be used, generally appropriate conditions are the concentration of an electrolyte: 1 to 80 wt %, the temperature of an electrolyte: 5 to 70° C., the current density: 0.5 to 60 $A/dm^2$, the voltage: 1 to 100

V and the time of electrolysis: 15 seconds to 50 minutes and they are so controlled as to produce the desired amount of an anodized layer.

In addition, the methods as described in JP 54-81133 A, JP 57-47894 A, JP 57-51289 A, JP 57-51290 A, JP 57-54300 A, JP 57-136596 A, JP 58-107498 A, JP 60-200256 A, JP 62-136596 A, JP 63-176494 A, JP 4-176897 A, JP 4-280997 A, JP 6-207299 A, JP 5-24377 A, JP 5-32083 A, JP 5-125597 A, JP 5-195291 A or the like may be used.

It is preferable that a sulfuric acid solution is used as an electrolyte as described in JP 54-12853 A and JP 48-45303 A among others. It is preferable that the concentration of sulfuric acid in an electrolyte is 10 to 300 g/L (1 to 30 wt %). In addition, the concentration of aluminum ion should preferably be 1 to 25 g/L (0.1 to 2.5 wt %), and more preferably be 2 to 10 g/L (0.2 to 1 wt %). An electrolyte like this can be prepared by adding aluminum sulfate or the like to a diluted sulfuric acid of concentration 50 to 200 g/L, for example.

If anodizing treatment is performed in an electrolyte containing sulfuric acid, either of direct current or alternating current can be impressed in-between an aluminum plate and an opposite pole.

If direct current is impressed to an aluminum plate, the current density should preferably be 1 to 60 A/dm$^2$, and more preferably to be 5 to 40 A/dm$^2$.

If anodizing treatment is continuously performed, it is preferable that in order to prevent so-called "burning" caused by concentration of current on a part of an aluminum plate, current with low current density of 5 to 10 A/dm$^2$ be allowed to flow at the beginning of anodizing treatment and the current density be increased to 30 to 50 A/dm$^2$ or higher while anodizing treatment progresses.

It is preferable that if anodizing treatment is continuously performed, the treatment is performed by an electric power supplying system via solution, in which electric power is supplied to an aluminum plate through an electrolyte.

A porous layer having many holes called pore (micropore) is obtained by performing anodizing treatment under the conditions like this. Generally, its average pore diameter is about 5 to 50 nm, and its average pore density is about 300 to 800 pcs/μm$^2$.

It is preferable that the amount of an anodized layer is 1 to 5 g/m$^2$. If less than 1 g/m$^2$, a plate is likely to be scratched, if more than 5 g/m$^2$, it is economically disadvantageous since a manufacturing process inevitably requires a large electric power energy. It is preferable that the amount of an anodized layer is 1.5 to 4 g/m$^2$. Moreover, it is preferable that the difference between the amount of the anodized layer in the center portion and in the vicinity of the edge portion is 1 g/m$^2$ or less.

Device for electrolysis as described in JP 48-26638 A, JP 47-18739 A, JP 58-24517 B or the like may be used for anodizing treatment.

Figure 4:
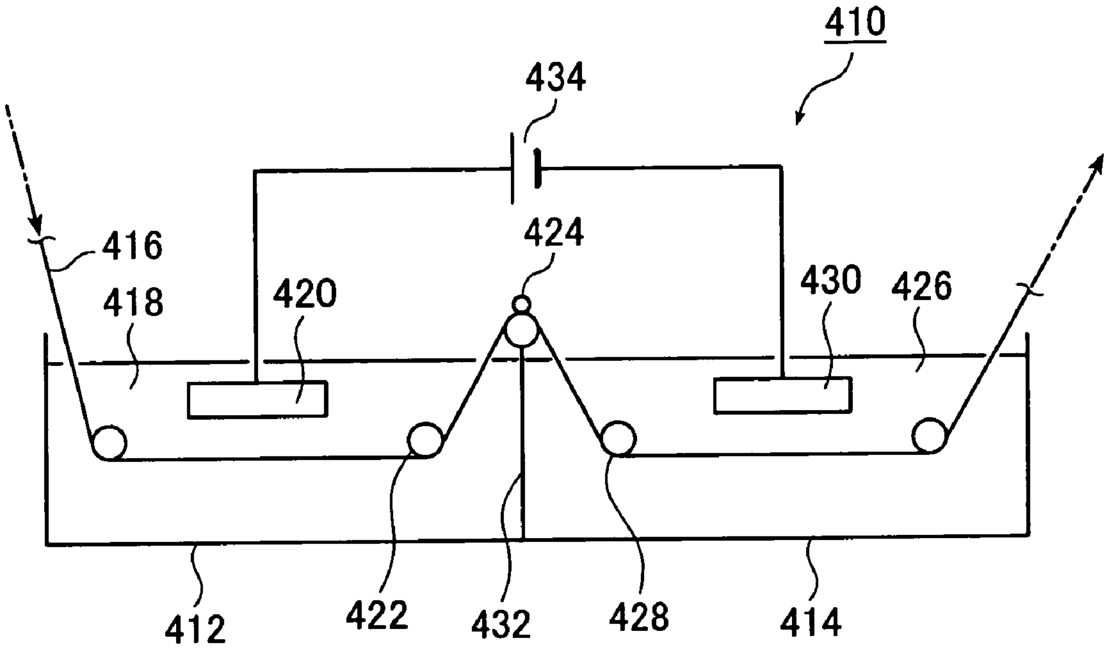
FIG. 4 is a schematic view of an anodizing device used for an anodizing treatment used in production of a support for a lithographic printing plate according to the present invention.

Among those, device as shown in FIG. 4 is preferably used. FIG. 4 is a schematic view that shows one example of device which performs anodizing treatment on an aluminum plate surface. In anodizing device 410, an aluminum plate 416 is transferred as shown by an arrow in FIG. 4. The aluminum plate 416 is positively charged by a feeding electrode 420 in a feeding bath 412 where an electrolyte 418 is stored. Then, after the aluminum plate 416 is transferred upward by a roller 422 in the feeding bath 412 and the direction of the transfer is changed downward by a nip roller 424, the plate is transferred to an electrolytic cell 414 where an electrolyte 426 is stored and the direction of the plate is changed to a horizontal direction by a roller 428. Thereafter, an anodized layer is formed on the surface of the aluminum plate 416 by negatively charging the plate with an electrolytic electrode 430, and the aluminum plate 416 coming out of the electrolytic cell 414 is transferred to a following process. In the anodizing treatment device 410, direction changeover means is composed of the roller 422, the nip roller 424, and the roller 428. The aluminum plate 416 is transferred in a mountain shape and a reversed U shape between the feeding bath 412 and the electrolytic cell 414 by the rollers 422, 424 and 428. The feeding electrode 420 and the electrolytic electrode 430 are connected to a direct current power supply 434.

The anodizing device 410 as shown in FIG. 4 is characterized by the feeding bath 412 and the electrolytic cell 414 partitioned with a bath wall 432, and transferring the aluminum plate 416 in a mountain shape and in a reversed U shape between the baths, thereby length of the aluminum plate 416 between the baths can be made to the shortest. Consequently, since the entire length of the anodizing device 410 can be shortened, the cost of equipment can be reduced. In addition, since the aluminum plate 416 is transferred in a mountain shape and a reversed U shape, the necessity of forming an aperture in the bath walls of each of the baths 412 and 414, through which the aluminum plate 416 is allowed to pass, is eliminated. Therefore, an amount of a supplied solution required to keep a solution level at a predetermined level in each bath 412 and 414 can be reduced, so that the operation cost can be reduced.

<Sealing Treatment>

In the present invention, sealing treatment for sealing micropores existent in the anodized layer may be performed as required. Sealing treatment may be performed according to the publicly known methods such as boiling water treatment, hot water treatment, steaming treatment, sodium silicate treatment, nitrite treatment and ammonium acetate treatment. The sealing treatment may be performed with the device and by the methods as described in JP 56-12518 B, JP 4-4194 A, JP 5-202496 A, JP 5-179482 A or the like, for example.

<Hydrophilic Treatment in the First Aspect According to the Present Invention>

In the first aspect according to the present invention, it is preferable that a hydrophilic treatment and a treatment with a liquid containing a rare-earth element ion are performed by sequentially on the aluminum plate after treatments which are performed as required such as the graining treatment and the anodizing treatment.

Hydrophilic treatments include potassium fluorozirconate treatment as described in U.S. Pat. No. 2,946,638, phosphomolybdate treatment as described in U.S. Pat. No. 3,201,247, alkyltitanate treatment as described in GB 1,108,559, polyacrylic acid treatment as described in DE 1,091,433, polyvinylphosphonic acid treatment as described in DE 1,134,093 and GB 1,230,447, phosphonic acid treatment as described in JP 44-6409 B, phytic acid treatment as described in U.S. Pat. No. 3,307,951, treatment with a salt of lipophilic organic high-molecular compound and divalent metal as described in JP 58-16893 A and JP 58-18291 A, treatment providing undercoat layer of hydrophilic cellulose (for example, carboxylmethylcellulose) containing water-soluble metallic salts (for example, zinc acetate) as described in U.S. Pat. No. 3,860,426 and treatment to apply undercoating of water-soluble polymer having sulfo group as described in JP 59-101651 A.

In addition, compounds used for undercoating treatment include phosphate as described in JP 62-019494 A, water-soluble epoxide compound as described in JP 62-033692 A, phosphoric acid-treated starch as described in JP 62-097892 A, diamines as described in JP 63-056498 A, inorganic amino acid or organic amino acid as described in JP 63-130391 A, organic phosphonic acid containing carboxy group or hydroxy group as described in JP 63-145092 A, compounds containing amino group and phosphonic group as described in JP 63-165183 A, specified carboxylic acid derivatives as described in JP 2-316290 A, phosphoric ester as described in JP 3-215095 A, compounds having one amino group and one oxoacid group of phosphor as described in JP 3-261592 A, aliphatic or aromatic sulfonic acid such as phenylsulfonic acid as described in JP 5-246171 A, compounds containing S atom such like thiosalicylic acid as described in JP 1-307745 A, and compounds having oxoacid group of phosphor or the like as described in JP 4-282637 A.

In addition, coloring by an acid dye as described in JP 60-64352 A can be performed.

Alkali metal silicate treatment with an aqueous solution containing alkali metal silicates such as sodium silicate and potassium silicate, a method of forming a hydrophilic undercoat layer by applying a hydrophilic vinylpolmer or a hydrophilic compound or the like are also preferably exemplified. Among them, the alkali metal silicate treatment is particularly preferable.

The alkali metal silicate treatment can be performed in accordance with the methods and steps as described in U.S. Pat. No. 2,714,066 and U.S. Pat. No. 3,181,461.

Although in the first aspect according to the present invention, the concentration of an alkali metal silicate aqueous solution is not particularly limited, preferably be 0.6 wt % or more, more preferably be 0.8 wt % or more, and preferably be 5.0 wt % or less, more preferably be 3.0 wt % or less. If the concentration stays in the above range, excellent scum resistance when processed into lithographic printing plate can be achieved although an image recording layer containing an infrared absorbent is used.

Alkali metal silicates are not particularly limited and include sodium silicate, potassium silicate and lithium silicate. They can be used in either of a single form or combinations of two kinds or more.

In addition, an aqueous solution containing alkali metal silicates may contain alkaline-earth metallic salts or fourth group (IVA group) metallic salts. Examples of alkaline-earth metallic salts are nitrates such as calcium nitrate, strontium nitrate, magnesium nitrate and barium nitrate; sulfates; chlorides; phosphates; acetates; oxalates; and borates. Examples of fourth group (IVA group) metallic salts are titanium tetrachloride, titanium trichloride, potassium titanium fluoride, potassium titanium oxalate, titanium sulfate, titanium tetraiodide, zirconium oxide chloride, zirconium dioxide, zirconium oxychloride, zirconium tetrachloride. These alkali earth metallic salts and fourth group (IVA group) metallic salts can be used in either of a single form or combinations of two kinds or more.

Alkali metal silicate treatment is performed by allowing an aluminum plate to contact with an alkali metal silicate aqueous solution after performing treatments which are performed thereon as required such as the graining treatment and the anodizing treatment. A method for allowing an aluminum plate to contact with an alkali metal silicate aqueous solution is not particularly limited, and taken up for example are a method for allowing an aluminum plate to pass through a bath containing the above aqueous solution, a method for allowing an aluminum plate to be immersed in a bath containing the above aqueous solution, and a method for spraying the above aqueous solution over the surface of an aluminum plate.

Although the conditions of hydrophilic treatment with an alkali metal silicate aqueous solution are not particularly limited, a liquid temperature is preferably 10 to 80° C. and more preferably 15 to 50° C. and a treatment time is preferably 1 to 100 seconds and more preferably is 5 to 20 seconds.

An amount of Si adsorbed by alkali metal silicate treatment can be measured with a flourescent X-ray analyzer, and its adsorbed amount should preferably be 1.0 to 15.0 mg/m$^2$, more preferably be 2.5 to 5.0 mg/m$^2$.

An effect to improve insolubility of the surface of a support for a lithographic printing plate with respect to an alkali developer can be obtained by performing this alkali metal silicate treatment. Further, since the elution of an aluminum component into the developer is suppressed, the generation of a development scum attributable to the exhaust of the developer can be reduced.

In addition, hydrophilic treatment by forming a hydrophilic undercoat layer may be performed under the conditions and steps as described in JP 59-101651 A and JP 60-149491 A.

An example of hydrophilic vinylpolymer to be used in this method is a copolymer of vinylpolymerizable compound having sulfo group such as polyvinylsulfonic acid and p-styrenesulfonic acid that has sulfo group, with ordinary vinylpolymerizable compound such as (meta)acrylic alkylester. In addition, an example of a hydrophilic compound to be used in the method is a compound containing at least one selected from a group consisting of —$NH_2$ group, —COOH group, and sulfo group.

<Treatment With a Liquid Containing Rare-earth Element Ion in the First Aspect According to the Present Invention>

Treatment with a liquid containing a rare-earth element ion is performed by allowing an aluminum plate to contact with a liquid containing a rare-earth element ion. A method for allowing an aluminum plate to contact with a liquid containing a rare-earth element ion is not particularly limited, and taken up for example are a method for allowing an aluminum plate to pass through a bath containing the liquid, a method for allowing an aluminum plate to be immersed in a bath containing the above liquid, and a method for spraying the above liquid over the surface of an aluminum plate.

A liquid containing a rare-earth element ion used for treatment with a liquid containing a rare-earth element ion is not particularly limited as long as it is a liquid containing a rare-earth element ion, and taken up for example is a solution and a suspension.

A liquid used for a liquid containing a rare-earth element ion may be either water or an organic solvent. These may be singly used or a combination of two kinds or more of these liquids which can be evenly mixed may be selected for use.

Taken up as organic solvents for example are alcohols (for example, methanol, ethanol, isopropanol, tetrahydrofurfurylalcohol, diacetonealcohol, ethyleneglycol, propyleneglycol, ethyleneglycolmonomethylether, ethyleneglycolmonoethylether, 1-methoxy-2-propanol and the like), hydrocarbons (for example, toluene, cyclohexane and the like), ketones (for example, acetone, methylethylketone, methylisobuthylketone, cyclohexanone and the like), esters (for example, ethyl acetate, methyl lactate, ethyl lactate, 2-methoxyethyl acetate, 1-methoxy-2-propyl acetate, and the like), ethers (for example, ethyleneglycoldimethylether, diethyleneglycoldimethylether, propyleneglycoldiethylether and the like), amides (for example, dimethylacetamide, dimethylformamide, N-methylpyrrolidone and the like) and γ-butyrolactone and dimethylsulfoxide.

It is preferable that a liquid containing a rare-earth element ion is an aqueous solution, a water-miscible polar solvent or a mixed solution thereof.

For rare-earth element ions used for a liquid containing a rare-earth element ion, each ion of ionic charge number which can be taken in each rare-earth element is taken up. A rare-earth element is not particularly limited, and taken up for example are Sc, Y, La, Ce, Pr, Nd, Pm, Sm, Eu, Gd, Tb, Dy, Ho, Er, Tm, Yb and Lu. Rare-earth element ions are singly used or a combination of two kinds or more is used.

A method for preparing the liquid containing a rare-earth element ion is not particularly limited and for example, the liquid can be obtained by dissolving or suspending a rare-earth element compound in a liquid such as water or the like using a conventionally known method.

Although the rare-earth element compound is not particularly limited, taken up for example are hydroxide, rare-earth element cationic salt compound, complex, double salt and the like.

An anion which is the counter ion of a salt may be either an inorganic anion or an organic anion. Taken up as inorganic anions for example are halogen ion (fluorine, chlorine, bromine and iodine as halogen elements), carbonate ion, borate ion, formate ion, nitrate ion, sulfite ion, sulfate ion, perchlorate ion, perbromate ion, periodate ion, phosphonate ion, phosphate ion, cyanate ion, thiocyanate ion, $PF_6^-$, $BF_4^-$ and the like.

Taken up as an organic anion is an ion of an organic compound containing at least one kind anionic group selected from carboxy group, sulfo group, phosphono group and oxyphosphono group.

Organic compounds containing these anionic groups may be either of aliphatic compounds, aromatic compounds and heterocyclic compounds.

Taken up as aliphatic compounds for example are straight-chained or branched alkane compounds with the number of carbons 1 to 12 that may have been substituted (for example, methane, ethane, propane, butane, pentane, hexane, heptane, octane, nonane, decane, dodecane), straight-chained or branched alkene compounds with the number of carbons 2 to 12 that may have been substituted (for example, ethene, propene, butene, pentene, hexene, heptene, octene, nonene, decene, dodecene), and straight-chained or branched alkyne compounds with the number of carbons 2 to 12 that may have been substituted (for example, acetylene, propyne, butyne, pentyne, hexyne, heptyne, octyne, nonyne, decyne, dodecyne).

Taken up as other aliphatic compounds for example is alicyclic hydrocarbon compounds with the number of ring membered carbons 5 to 22 that may have been substituted.

Taken up as alicyclic hydrocarbon compounds with the number of ring membered carbons 5 to 22 for example are cyclopentane, cyclopenten, cyclopentadiene, cyclohexane, cyclohexene, cyclohexadiene, cycloheptane, cycloheptene, cycloheptadiene, cyclooctane, cyclooctene, cyclooctadiene, cyclooctatriene, cyclononane, cyclononene, cyclodecane, cyclodecene, cyclodecanediene, cyclodecanetriene, cycloundecane, cyclododecane, bicycloheptane, bicyclohexane, dicyclohexene, tricyclohexene, norcarane, norpinane, norbornane, norbornene, norbornadiene, tricycloheptane, tricycloheptene, decaline, adamantane and the like.

Taken up as aromatic compounds for example are monocyclic compounds, condensed ring compounds which have 2 to 5 rings and polycyclic hydrocarbons in which aromatic rings are directly bonded (for example, biphenyl) that may have been substituted.

Concretely, taken up as aromatic hydrocarbons for example are benzene, naphthalene, dihydronaphthalene, tetralin, indene, indan, benzocyclobutene, benzocycloheptene, bennzocyclooctene, hydrobenzocycloheptene, hydrobenzocyclooctene, anthracene, phenanthrene, phenarene, indacene, fluorene, acenaphthylene, acenaphthene, biphenylene, biphenyl, terphenyl and the like.

Taken up as heterocyclic compounds for example are heterocyclic hydrocarbon compounds comprising each monocyclic (for example, 5 to 10-membered ring), polycyclic or crosslinked-cyclic structure containing at least any one of oxygen element, sulfur element and nitrogen element. These heterocyclic compounds may have been substituted.

Concretely, taken up as heterocyclic compounds for example are tetrahydrofuran, dihydrofuran, furan, pyrrole, pyrroline, pyrrolidine, pyrazole, pyrazoline, pyrazolidine, imidazole, imidazoline, imidazolidine, triazole, triazoline, triazolidine, tetrazole, tetrazoline, tetrazolidine, thiophene, dihydrothiophene, tetrahydrothiphene, isoxazole, isoxazoline, isoxazolidine, oxazole, oxazoline, oxazolidine, isothiazole, isothiazoline, isothiazolidine, thiazole, thiazoline, thaizolidine, pyridine, hydropyridine, piperiodine, pyridazine, hydropyridazine, pyrimidine, pyrazine, piperazine, pyrane, hydropyrane, thiopyrane, hydrothiopyrane, oxazin, morpholine, azepine, hydroazepine, oxepine, hydrooxepine, thiepine, thiosine, hydrothiosine, oxazepine, thiazepine, oxathiepine, hydrooxathiepine, isoindole, indoline, indole, isoindoline, carbazole, indazole, benzimidazole, hydrobenzimidazole, benzotriazole, inbenzofuran, benzoxazole, benzothiophene, benzodithiol, hydrobenzoxazole, benzoisoxazole, benzothiazole, benzoisothiazole, benzoxathiol, quinoline, isoquinoline, acridine, quinazoline, benzopyrane, benzothiopyrane, hydrobenzopyrane, benzoxazin, benzothiazine, phenoxazine, pyrrolidine, quinolizine, quinolizidine, indolizine, pyrrolizidine, purine, isochroman, chroman, bipyridine, bithiophene, quinuclidine, pyperazine and the like.

Monovalent nonmetallic atomic group other than hydrogen is taken up as a substituent which can substitute these organic compounds. Preferably taken up for example are halogen atoms (fluorine atom, chlorine atom, bromine atom, iodine atom), —CN, $—NO_2$, formyl group, —SH, —OH, $—OR^1$, $—SR^1$, $—COOR^1$, $—OCOR^1$, $—SO_2R^1$, $—COR^1$, $—NHCONHR^1$, $—CON(R^2)(R^3)$, $—SO_2N(R^2)(R^3)$, $—N(R^4)COR^1$, $—N(R^4)SO_2R^1$, $—N(R^2)(R^3)$, $—N^+(R^2)(R^3)(R^5)$, $—P(=O)(R^6)(R^7)$, $—Si(R^8)(R^9)(R^{10})$, aryl group, heterocyclic group and the like.

In the above, $R^1$ represents either of a straight-chain or branched alkyl group with the number of carbons 1 to 12 that may have been substituted (taken up as alkyl groups for example are methyl group, ethyl group, propyl group, butyl group, pentyl group, hexyl group, heptyl group, octyl group, nonyl group, decyl group, undecyl group, dodecyl group and the like.), a straight-chain or branched alkenyl group or alkynyl group with the number of carbons 2 to 12 that may have been substituted (taken up as alkenyl groups for example are vinyl group, propenyl group, butenyl group, pentenyl group, hexenyl group, octenyl group, decenyl group, dodecenyl group and the like and taken up as alkynyl groups for example are ethynyl group, propynyl group, buthynyl group, hexynyl group, octhynyl group, decynyl group, dodecynyl group and the like.), a monocyclic, polycyclic or crosslinked-cyclic alicyclic hydrocarbon group with the number of carbons 5 to 22 that may have been substituted (concretely taken up is monovalent organic residue of each of alicyclic hydrocarbon compounds as listed above.), an aromatic group with the number of carbons 6 to 12 that may have been substituted (concretely taken up is monovalent organic residue of each of aromatic compounds as listed above.) and a heterocyclic group that may have been substituted (concretely taken up is monovalent organic residue of each of heterocyclic compounds as listed above.).

$R^2$ and $R^3$ independently represent hydrogen atom or the same as the above $R^1$.

In addition, $R^2$ and $R^3$ may form a ring containing nitrogen atom. Taken up for example are pyrazine ring, piperidine ring, morpholine ring, pyrrole ring, pyrazole ring, imidazole ring, imidazolidine ring, oxazolidine ring, thiazolidine ring, azepine ring, hydroazepine ring and the like.

$R^4$ represents hydrogen atom or the same as the above $R^1$.

$R^5$ represents hydrogen atom or the same as the above $R^1$. In the substitute $—N^+(R^2)(R^3)(R^5)$, $R^2$, $R^3$ and $R^5$ may be either all the same or different from each other.

$R^6$ represents —OH, a hydrocarbon group or the aforementioned $—OR^1$ and $R^7$ represents a hydrocarbon group or the aforementioned $—OR^1$. Taken up as hydrocarbon groups are a residue in which one hydrogen atom is removed from the aforementioned aliphatic compound and a residue in which one hydrogen atom is removed from the aforementioned aromatic hydrocarbon. In the substitute $—P(=O)(R^6)(R^7)$, $R^6$ and $R^7$ may be the same or different from each other.

$R^8$, $R^9$ and $R^{10}$ independently represent a hydrocarbon group or the aforementioned $—OR^1$. Taken up as hydrocarbon groups are a residue in which one hydrogen atom is removed from the above aliphatic compound and a residue in which one hydrogen atom is removed from the above aromatic hydrocarbon. In the substitute $—Si(R^8)(R^9)(R^{10})$, $—OR^1$ is preferably 2 or less.

Concretely taken up as the aryl group is a residue in which one hydrogen atom is removed from the above aromatic hydrocarbon.

Concretely taken up as the heterocyclic group is a residue in which one hydrogen atom is removed from the nucleus of the above heterocyclic compound.

In addition, each substitute mentioned as above described may be further substituted. Taken up as a substitute capable of substituting each substitute are the same substitutes as listed as substitutes capable of substituting organic compounds.

For the complex of the rare-earth element, a ligand thereof may be either inorganic or organic.

Taken up as an inorganic ligand for example are the same inorganic anions as listed as anions which are the counter ion of the salt.

Taken up as organic ligands for example are ones as described on Pages 1620 to 1630 in "Shin-jikken-kagaku-kouza (New Experimental Chemistry Course) 8, Synthesis of Inorganic Compounds III" (published by MARUZEN Co., Ltd. in 1997).

Taken up as concrete examples of complexes are compounds as described in Chapter 4, "4th Edition Jikken-kagaku-kouza (Experimental Chemistry Course) 17, Inorganic Complexes/Chelate Complexes" (published by MARUZEN CO., LTD in 1991) and Chapter 12, "Shin-jikken-kagaku-kouza (New Experimental Chemistry Course) 8, Synthesis of Inorganic Compounds III" (published by MARUZEN Co., Ltd. in 1997) and the like.

Taken up as double salts for example are double salts with nitrates, sulfates or carbonates of alkali metals, alkaline earth metals or ammonium ($NH_4^+$). Concretely taken up are compounds as described in each rare-earth element compounds and the like in Chapter 8, "Shin-jikken-kagaku-kouza (New Experimental Chemistry Course) 8, Synthesis of inorganic Compounds II" (published by MARUZEN CO., LTD. in 1997) and in "Kagaku-daijiten (ENCYCLOPAEDIA CHIMICA)" (published by KYORITSU SHUPPAN CO., LTD. in 1981).

Among these rare-earth element compounds, Y, La, Ce, Pr, Nd and Yb are preferable and particularly preferable is Ce as a rare-earth element in terms of press life.

These are used either singly or in a combination of two kinds or more.

Taken up as preferable concrete examples of rare-earth element compounds are hydroxide; chloride, fluoride, bromide, carbonate, nitrate, sulfate, perchlorate, phosphonate, phosphate, organic acid salt (taken up as preferable organic acids are acetic acid, oxalic acid, trifluoroacetate, propionic acid, glycolic acid, glyoxylic acid, lactic acid, pyruvic acid, alanine, sarcosine, succinic acid, fumaric acid, maleic acid, acetylenedicarboxylic acid, malic acid, tartaric acid, citric acid, shikimic acid, anthranilic acid, salicylic acid, sulfosalicylic acid, aminosalicylic acid, phthalic acid, isophthalic acid, terephthalic acid, o-sulfobenzenecarboxylic acid, iminodiacetic acid, ethylenediaminetetraacetic acid, cystein, picolinic acid, proline acid, methanesulfonic acid, trifluoromethanesulfonic acid, propanesulfonic acid, hydroxypropanesulfonic acid, gutanesulfonic acid, taurine, toluenesulfonic acid, naphthalenedisulfonic acid, benzenephosphonic acid, ethaneoxyphosphonic acid and the like.); organic complex (taken as complex ligand compounds are acethylacetonate, acetoacetonate, pivaloylacetonate, 2-picoline-N-oxide, tropolonate, 8-quinolate, benzo-15-crown-5, diethyldithiofurvamate, iminodiacetate, nicotinate and the like); double salt including nitrate, sulfate or carbonic acid with ammonium or alkali metals (Li, K, Na and the like).

More concretely taken up are ammonium cerium (IV) sulfate, cerium (III) sulfate, tetraammonium cerium (IV) sulfate, cerium dioxide, cerium (III) carbonate, cerium (III) acethylacetonate, diammonium cerium (IV) sulfate, cerium (III) nitrate, ammonium cerium (IV) nitrate, ammonium cerium (III) nitrate, cerium oxalate (III), cerium bromide (III), cerium acetate (III), cerium chloride (III); lanthanum chloride, lanthanum acetate, lanthanum oxide, lanthanum oxalate, lanthanum nitrate, lanthanum carbonate, tri(methoxyethoxy) lanthanum, lanthanum fluoride, methoxyethoxy lanthanum, lanthanum acethylacetonate, lanthanum methoxyethylate; europium (III) chloride, europium (III) oxide, europium (III) nitrate, europium (III) acethylacetonate; yttrium acethylacetonate, yttrium dipivaloylmethanate, yttrium chloride, yttrium acetate, yttrium oxide, yttrium nitrate, yttrium carbonate, yttrium fluoride; praseodymium (III) chloride, praseodymium oxide, praseodymium (III) nitrate; neodymium chloride, neodymium oxide, neodymium nitrate, neodymium carbonate, neodymium fluoride, neodymium acetonate; samarium chloride, samarium (III) oxide, samarium (III) nitrate, samarium (III) acethylacetonate; gadolinium oxide, gadolinium nitrate, gadolinium fluoride; terbium (III) chloride, terbium oxide, terbium (III) nitrate; dysprosium oxide, dysprosium nitrate, dysprosium carbonate; holmium chloride, holmium oxide; erbium acethylacetonate, erbium oxide, erbium carbonate; thulium oxide; ytterbium oxide, ytterbium (III) nitrate; lutetium oxide, lutetium nitrate and the like.

These are used either singly or in a combination of two kinds or more.

Although the concentration of a rare-earth element compound in a liquid containing a rare-earth element ion is not particularly limited if an amount of attaching of a rare-earth element atom on the surface of a support for a lithographic printing plate stays in the range later described, the amount of adhering should preferably be 0.01 g/L or more, more preferably be 0.1 g/L or less and preferably be 100 g/L or less and more preferably be 10 g/L or less.

Although the conditions of the treatment with a liquid containing a rare-earth element ion are not particularly limited, a liquid temperature should preferably be 10 to 100° C., more preferably be 20 to 60° C. and a treatment time should preferably be 1 to 100 seconds and more preferably be 5 to 20 seconds.

A liquid containing a rare-earth element ion can contain metal ions and the like other than the rare-earth element ions in a range that does not impair the purpose of the present invention. For example, press life can be improved by simultaneously using a trace of Na, K or Ca, or heavy metals such as Co.

Although a lithographic printing plate in the first aspect according to the present invention can be obtained by sequentially performing hydrophilic treatment and a treatment with a liquid containing a rare-earth element ion on an aluminum plate after performing anodizing treatment thereon as described above, it can be also obtained by performing a treatment on an aluminum plate with a liquid used for hydrophilic treatment such as alkali metal silicate aqueous solution in which a rare-earth element ion is contained after performing anodizing treatment thereon. In this case, the conditions can be suitably selected for use from the conditions that hydrophilic treatment and a treatment with a liquid containing a rare-earth element ion are performed by sequentially.

<Hydrophilic Treatment in the Second Aspect According to the Present Invention>

In the second aspect according to the present invention, hydrophilic treatment is performed on an aluminum plate with an alkali silicate aqueous solution with the concentration of 0.6 to 5.0 wt % after performing graining treatment, anodizing treatment and other treatments if required thereon, as described above.

The contents of the hydrophilic treatment with an alkali metal silicate aqueous solution used in the second aspect according to the present invention are the same as in the case in the first aspect according to the present invention as described above.

<Treatment with an Aqueous Solution Containing a Carboxylic Acid and/or a Carboxylate of an Element in the 3rd to the 7th Groups and the 13th to the 16th Groups of the Periodic Table in the Second Aspect According to the Present Invention>

In the second aspect according to the present invention, a treatment is further performed with an aqueous solution containing a carboxylic acid and/or a carboxylate of an element in the 3rd to the 7th groups and the 13th to the 16th groups of the periodic table after the above hydrophilic treatment.

Carboxylic acid is not particularly limited and taken up for example are formic acid, aliphatic carboxylic acid, aromatic carboxylic acid and heterocyclic carboxylic acid. Carboxylic acid may be monocarboxylic acid or polybasic acids such as dicarboxylic acid and tricaboxylic acid.

Taken up as aliphatic carboxylic acids are a straight chain or branched alkane carboxylic acid with the number of carbons 1 to 22 that may have been substituted, a straight chain or branched alkene or alkyne carboxylic acid with the number of carbons 3 to 22 that may have been substituted. If these carboxylic acids are monocarboxylic acids, the number of carbons is preferably 12 or less.

Taken up as other aliphatic carboxylic acids for example are alicyclic hydrocarbon carboxylic acids with the number of ring membered carbons 5 to 22 that may have been substituted. If they are monocarboxylic acids, the number of carbons is preferably 12 or less. Taken up as alicyclic hydrocarbons for example are monocyclic, polycyclic and crosslinked-cyclic alicyclic hydrocarbons.

Taken up as concrete alicyclic hydrocarbons for example are the ones as listed above as alicyclic hydrocarbon compounds with the number of ring membered carbons 5 to 22.

Taken up as aromatic carboxylic acids for example are carboxylic acids of monocyclic compounds, condensed ring compounds which have 2 to 5 rings and polycyclic hydrocarbons in which aromatic rings are directly bonded (for example, biphenyl) that may have been substituted.

Taken up as concrete aromatic hydrocarbons for example are the ones as exemplified above.

Taken up as heterocyclic carboxylic acids for example are heterocyclic carboxylic acids comprising monocyclic (for example, 5-10 membered ring), polycyclic or crosslinked-cyclic structure containing at least one of oxygen atom, sulfur atom and nitrogen atom. These hetetocyclics may be substituted.

Concretely, taken up as heterocyclic rings for example are the ones as exemplified above.

Taken up as substitutes which can substitute these carboxylic acids are monovalent nonmetallic groups other than hydrogen. Preferably taken up for example are halogen atoms (fluorine atom, chlorine atom, bromine atom, iodine atom), —CN, —$NO_2$, formyl group, —SH, —OH, —$OR^{11}$, —$SR^{11}$, —$COOR^{11}$, —$OCOR^{11}$, —$SO_2R^{11}$, —$COR^{11}$, —$NHCONHR^{11}$, —$CON(R^{12})(R^{13})$, —$SO_2N(R^{12})(R^{13})$, —$N(R^{14})COR^1$, —$N(R^{14})SO_2R^1$, —$N(R^{12})(R^{13})$, —$N^+(R^{12})(R^{13})(R^{15})$, —$P(=O)(R^{16})(R^{17})$, —$Si(R^{18})(R^{19})(R^{20})$, aryl group, heterocyclic group and the like.

In the above, $R^{11}$ represents either of a straight-chain or branched alkyl group with the number of carbons 1 to 22 that may have been substituted (taken up as alkyl groups for example are methyl group, ethyl group, propyl group, butyl group, pentyl group, hexyl group, heptyl group, octyl group, nonyl group, decyl group, undecyl group, dodecyl group, tridecyl group, tetradecyl group, pentadecyl group, hexadecyl group, heptadecyl group, octadecyl group, nonadecyl group, eicosyl group, heneicosyl group, docosyl group and the like.), a straight-chain or branched alkenyl group or alkynyl group with the number of carbons 2 to 22 that may have been substituted (taken up as alkenyl groups for example are vinyl group, propenyl group, butenyl group, pentenyl group, hexenyl group, octenyl group, decenyl group, dodecenyl group, tridecenyl group, tetradecenyl group, hexadecenyl group, octadecenyl group, eicocenyl group, dococenyl group, butadienyl group, heptadienyl group, hexadienyl group, octadienyl group and the like and taken up as alkynyl groups for example are ethynyl group, propynyl group, buthynyl group, hexynyl group, octhynyl group, decynyl group, dodecynyl group and the like.), a monocyclic, polycyclic or crosslinked-cyclic alicyclic hydrocarbon group with the number of carbons 5 to 22 that may have been substituted (concretely taken up is monovalent organic residue of each of alicyclic hydrocarbon compounds as listed above.), an aromatic group with the number of carbons 6 to 14 that may have been substituted (concretely taken up is monovalent organic residue of each of aromatic compounds as listed above.) and a heterocyclic group that may have been substituted (concretely taken up is monovalent organic residue of each of heterocyclic compounds as listed above.).

$R^{12}$ and $R^{13}$ independently represent hydrogen atom or the same as the above $R^{11}$.

In addition, $R^{12}$ and $R^{13}$ may form a ring containing nitrogen atom. Taken up for example are pyrazine ring, piperidine ring, morpholine ring, pyrrole ring, pyrazole ring, imidazole ring, imidazolidine ring, oxazolidine ring, thiazolidine ring, azepine ring, hydroazepine ring and the like.

$R^{14}$ represents hydrogen atom or the same as the above $R^{11}$.

$R^{15}$ represents hydrogen atom or the same as the above $R^{11}$. In the substitute $—N^+(R^{12})(R^{13})(R^{15})$, $R^{12}$, $R^{13}$ and $R^{15}$ may be either all the same or different from each other.

$R^{16}$ represents —OH, a hydrocarbon group or the above $—OR^{11}$, and $R^{17}$ represents a hydrocarbon group or the above $—OR^{11}$. Taken up as hydrocarbon groups are groups used in the above aliphatic carboxylic acids and groups used in aromatic carboxylic acids. In a substitute, $—P(=O)(R^{16})(R^{17})$, $R^{16}$ and $R^{17}$ may be the same or different from each other.

$R^{18}$, $R^{19}$ and $R^{20}$ independently represent a hydrocarbon group or the above $—OR^{11}$. Taken up as hydrocarbon groups are groups used in the above aliphatic carboxylic acids and groups used in aromatic carboxylic acids. In a substitute, $—Si(R^{18})(R^{19})(R^{20})$, it is preferable that $—OR^{11}$ is 2 or less.

Concretely taken up as aryl groups are residues in which one hydrogen atom is removed from the nucleus of the above aromatic hydrocarbons.

Concretely taken up as heterocyclic groups are residues in which one hydrogen atom is removed from the nucleus of the above heterocyclic rings.

In addition, each substitute mentioned above may be further substituted. Taken up as substitutes that can substitute each substitute are the same substitutes as listed for substitutes which can substitute carboxylic acid.

Although concrete examples of carboxylic acids used in the second aspect according to the present invention are listed up below, carboxylic acids according to the present invention are not limited to these acids.

Taken up as monocarboxylic acids for example are formic acid, acetic acid, propionic acid, butyric acid, isobutylic acid, valeric acid, isovaleric acid, pivalic acid, hekanoic acid, heptanoic acid, octanoic acid, nonanoic acid, decanoic acid, lauric acid, crotonic acid, sorbic acid, vinylacetic acid, butanoic acid, pentencarboxylic acid, proponylic acid, phenylacetic acid, 3-phenylpropionic acid, naphthylacetic acid, cyclohexanecarboxylic acid, cyclohexylmethylcarboxylic acid, cyclopentanecarboxylic acid, cyclooctanecarbpxylic acid, cyclodecanecarboxylic acid, adamantanecarboxylic acid, isobornenecarboxylic acid, benzoic acid, naphthalene carboxylic acid, toluic acid, cinnamic acid, tropic acid, salicylic acid, acetylsalicylic acid, aminosalicylic acid, anisic acid, vanillic acid, nitrobenzoic acid, cyanobenzoic acid, veratric acid, piperonylic acid, protocatechuic acid, gallic acid, homovanillic acid, caffeic acid, ferulic acid, benzoylbenzoic acid, acethylbenzoic acid, chlorobenzoic acid, dichlorobenzoic acid, trimethylbenzoic acid, N,N-dimethylaminobenzoic acid, aminonaphthalenecarboxylic acid, chloroacetic acid, dichloroacetic acid, trichloroacetic acid, trifluoroacetic acid, 3-methylthiopropionic acid, 3-phenylthiopropionic acid, 3-oxovalleric acid, methoxycarbonylacetic acid, 3,5-dioxovalleric acid, β-oxocyclohexanepropionic acid, β-oxo-3-pyridinepropionic acid, furancaboxylic acid, pyridinecarboxylic acid, picolinic acid, nicotinic acid, isonicotinic acid, quinolinecarboxylic acid, indoleacetic acid, 4-isoindolebutanoic acid, thiophenecarboxylic acid, glyoxylic acid, prolinepyruvic acid, acetoacetic acid, levulinic acid, glycolic acid, mercaptoacetic acid, lactic acid, glyceric acid, succinic acid monoamide, carbamoylbenzoic acid, camphoric acid, benzilic acid, orotic acid, N-methylcarbamoylglutaric acid, acetoamidoacetic acid, 3-(trimethylsilyl)propionic acid, uroxanic acid, uronic acid, α-aminocarboxylic acids (for example, glycine, alanine, aminobutyric acid, vanillin, leucine, sarcosine, aminopropionic acid, aminohippuric acid, isovaline, norvaline, isoleucine, norleucine, ornithine, lysine, homolysine, asparagine, glutamine, creatine, norarginine, citrulline, serine, azeserine, threonine, homoserine, carnitine, cysteine, acethylcysteine, homocysteine, methionine, ethionine, penicillamine, phenylalanine, tyrosine, thyronine, tryptophane, histidine, valine and the like).

Taken up polybasic acids (polycarboxylic acid) for example oxalic acid, malonic acid, succinic acid, glutaric acid, adipic acid, pimelic acid, suberic acid, azelaic acid, sebacic acid, maleic acid, fumaric acid, citraconic acid, mesaconic acid, acethylenedicarboxylic acid, itaconic acid, alkyl-substituted succinic acid (taken up as alkyl groups are methyl group, ethyl group, butyl group, oxyl group, octyl group, and decyl group), cyclobutanedicarboxylic acid, cyclopentanedicarboxylic acid, cyclohexanedicarboxylic acid, cycloheptanedicarboxylic acid, cyclooctanedicarboxylic acid, cyclohexanetricarboxylic acid, norbornenedicarboxylic acid, bicyclo[2.2.2]octo-7-en-tetracarboxylic acid, tricyclo[5.2. $1.0^{2,6}$]decanedicarboxylic acid, cyclohexanetetracarboxylic acid, benzenedicarboxylic acid (for example, phthalic acid, isophthalic acid, terephthalic acid), biphenyldicarboxylic acid, tetrachlorobenzenedicarboxylic acid, benzenetricarboxylic acid, benzenetetracarboxylic acid, naphthalenedicarboxylic acid, anthracenedicarboxylic acid, naphthalenetricarboxylic acid, naphthalenetetracarboxylic acid, anthracenetricarboxylic acid, tetrahydrophthallic acid, hexahydrophthalic acid, iminodiacetic acid, nitrilotriacetic acid, ethylenediaminetetraacetic acid, asparagine acid, glutamic acid, lanthionine, cystathionine, kainic acid, mesoxalic acid, oxalacetic acid, glyceric acid, malic acid, tartaric acid, gluconic acid, citric acid, shikimic acid, quinic acid, thiophenedicarboxylic acid, pyridinedicarboxylic acid, 4,4'-oxodibenzoic acid, bicyclo[2.2.2]octo-5-en-dicarboxylic acid, 2,2-biquinoline-4,4'-dicarboxylic acid, chelidamic acid, coumalic acid and the like.

These carboxylic acids are used either singly or in a combination of two kinds or more.

Taken up as the carboxylate of an element in the 3rd to the 7th group and the 13th to the 16th groups of the periodic table are each carboxylate described above of an element in the 3rd to the 7th groups and the 13th to the 16th groups of the periodic table.

Taken up as elements in the 3rd to the 7th groups and the 13th to the 16th groups of the periodic table for example are Al, Sc, Ga, Ti, Ge, V, Cr, Mn, Y, In, Zr, Sn, Nb, Sb, Mo, Tc, each element of lanthanoid (La, Ce, Pr, Nd, Pm, Sm, Eu, Gd, Tb, Dy, Ho, Er, Tm, Yb and Lu), Tl, Hf, Pb, Ta, Bi, W, PO and Re.

Carboxylates of the element in the 3rd to the 7th groups and the 13th to the 16th groups of the periodic table are used either singly or in a combination of two kinds or more.

In addition, a combination of one kind of carboxylic acid or more and one kind of carboxylate or more may be used.

Although the concentration of the aqueous solution containing the carboxylate of the carboxylic acid and/or the carboxylate of the element in the 3rd to the 7th groups and the 13th to the 16th groups of the periodic table is not particularly limited, it should preferably be 0.01 wt % or more, more preferably be 0.05 wt % or more, and preferably be 10 wt % or less, more preferably be 1 wt % or less. Press life can be excellent when processed into a lithographic printing plate is if the concentration stays in the above range.

A treatment with the aqueous solution containing the carboxylic acid and/or the carboxylate of the element in the 3rd to the 7th groups and the 13th to the 16th groups of the periodic table is performed by allowing an aluminum plate to contact with an aqueous solution containing the carboxylic acid and/or the carboxylate of the element in the 3rd to the 7th groups and the 13th to the 16th groups of the periodic table after hydrophilic treatment is performed thereon with the alkali metal silicate aqueous solution. A method for allowing an aluminum plate to contact with the aqueous solution containing the carboxylic acid and/or the carboxylate of the element in the 3rd to the 7th groups and the 13th to the 16th groups of the periodic table is not particularly limited, and taken up for example are a method for allowing an aluminum plate to pass through a bath containing the above aqueous solution, a method for allowing an aluminum plate to be immersed in a bath containing the above aqueous solution and a method for spraying the above aqueous solution over the surface of an aluminum plate.

Although the conditions of the treatment with the aqueous solution containing the carboxylic acid and/or the carboxylate of the element in the 3rd to the 7th groups and the 13th to the 16th groups of the periodic table are not particularly limited, a liquid temperature should preferably be 15 to 100° C., more preferably be 20 to 50° C. and a treatment time should preferably be 1 to 100 seconds and more preferably be 5 to 20 seconds.

In the second aspect according to the present invention, as described above, a support for a lithographic printing plate is obtained by performing hydrophilic treatment with an alkali metal silicate aqueous solution with the concentration of 0.6 to 5.0 wt % after performing graining treatment and anodizing treatment and further performing a treatment thereon with an aqueous solution containing the carboxylic acid and/or the carboxylate of an element in the 3rd to the 7th groups and the 13th to the 16th groups of the periodic table. Even if a presensitized plate in which the resultant support for a lithographic printing plate is provided with an image recording layer has the image recording layer containing an infrared absorbent, both excellent scum resistance and press life can be achieved when processed into a lithographic printing plate.

<Water Washing Treatment>

It is preferable that water washing is performed after aforementioned each treatment is finished. Pure water, well water, city water or the like can be used for water washing. It is acceptable that a nip device may be used to prevent the treatment solution from being brought into the next process.

The support for a lithographic printing plate in the first aspect according to the present invention that can be obtained as described above is characterized in that an amount of attaching a rare-earth element atom on the surface thereof should be 0.1 mg/m$^2$ or more, preferably be 1 g/m$^2$ or more, more preferably be 3 mg/m$^2$ or more, and should be 20 mg/m$^2$ or less, preferably be 15 mg/m$^2$ or less, more preferably be 10 mg/m$^2$ or less. A presensitized plate excellent in both scum resistance and press life when processed into a lithographic printing plate can be obtained if the amount stays in the above range.

In the present invention, the adhering amount of a rare-earth element atom to the surface of a support for a lithographic printing plate can be measured in calibration curve method using a X-ray Fluorescence Spectrometer (XRF). As a standard sample for forming a calibration curve, the one can be used, which is dried after an aqueous solution containing the known amount of a rare-earth element atom is evenly dropped onto an area of 30 mmϕ on the surface of the aluminum plate. The kind of an X-ray Fluorescence Spectrometer and other conditions are not particularly limited. One example of the conditions for X-ray Fluorescence Spectrometry of a rare-earth element atom is shown below. The adhering amount of a rare-earth element atom can be calculated by the peak height of a rare-earth element atom spectrum.

X-ray Fluorescence Spectrometer: Rigaku Industrial Corporation-made RIX3000, X-ray tube: Rh, Tube voltage: 50 kV, Tube current: 50 mA, Slit: COARSE, Analyzing crystal: LiF(200), Analyzed area: 30 mmϕ, Accumulation time: 80 sec/sample, Measured spectrum, Peak position, Backgrounds and Detector: as shown in Table 1.

TABLE 1

| | Rare-earth element | | | | | | | | | | | | | | | | |
|---|---|---|---|---|---|---|---|---|---|---|---|---|---|---|---|---|---|
| | Sc | Y | La | Ce | Pr | Nd | Pm | Sm | Eu | Gd | Tb | Dy | Ho | Er | Tm | Yb | Lu |
| Peak spectrum | Sc-Kα | Y-Kα | La-Lα | Ce-Lα | Pr-Lα | Nd-Lα | Pm-Lα | Sm-Lα | Eu-Lα | Gd-Lα | Tb-Lα | Dy-Lα | Ho-Lα | Er-Lα | Tm-Lα | Yb-Lα | Lu-Lα |
| Peak position (deg) | 97.74 | 23.78 | 82.88 | 78.98 | 75.40 | 72.10 | 69.03 | 66.20 | 63.54 | 61.08 | 58.77 | 56.57 | 54.52 | 52.58 | 50.77 | 49.04 | 47.41 |
| Back-grounds (2θ) | 95.24<br>100.24 | 23.08<br>24.78 | 82.18<br>83.58 | 78.30<br>79.70 | 74.70<br>76.1 | 71.4<br>72.8 | 68.33<br>69.73 | 65.5<br>66.9 | 62.84<br>64.24 | 60.38<br>61.78 | 58.07<br>59.47 | 55.87<br>57.27 | 53.82<br>55.22 | 51.88<br>53.28 | 50.07<br>51.47 | 48.34<br>49.74 | 46.71<br>47.41 |
| Detector | F-PC | SC | SC | SC | SC | SC | SC | SC | SC | SC | SC | SC | SC | SC | SC | SC | SC |

<Aluminum Plate (Rolled Aluminum)>

An aluminum plate publicly known can be used to obtain a support for a lithographic printing plate according to the present invention. An aluminum plate used in the present invention is a metal having an aluminum which is stable in dimension as a main component, and is composed of aluminum or aluminum alloy. Besides a pure aluminum plate, an alloy plate containing aluminum as main component and a trace of different elements can be used.

In the present invention, various substrates composed of the aforementioned aluminum or aluminum alloys, and referred to collectively as an aluminum plate. Different elements that may be contained in the aluminum alloy are silicon, iron, manganese, copper, magnesium, chromium, zinc, bismuth, nickel, titanium or the like, and the contents of the different elements in the alloy is 10 wt % or less.

Like this, the composition of an aluminum plate used in the present invention is not specified. For example, the materials conventionally known as described in Aluminum Handbook 4th edition (published by Japan Light Metal Association in 1990) that are, for example, an Al—Mn type aluminum plate of JIS A1050, JIS A1100, JIS A1070, JIS A3004 containing Mn, the internationally registered alloy 3103A and the like can be appropriately utilized. In addition, an Al—Mg type alloy and Al—Mn—Mg type alloy (JIS A3005) into which 0.1 wt % or more of Mg is added can be used to increase tensile strength. Moreover, Al—Zr type or Al—Si type alloy containing Zr or Si can be used. Further, Al—Mg—Si type alloy can also be used.

With regard to JIS1050 materials, the arts that have been proposed by the inventors of the present invention are described in JP 59-153861 A, JP 61-51395 A, JP 62-146694 A, JP 60-215725 A, JP 60-215726 A, JP 60-215727 A, JP 60-216728 A, JP 61-272367 A, JP 58-11759 A, JP 58-42493 A, JP 58-221254 A, JP 62-148295 A, JP 4-254545 A, JP 4-165041 A, JP 3-68939 B, JP 3-234594 A, JP 1-47545 B and JP 62-140894 A. Also known are the arts which have been described in JP 1-35910 B and JP 55-28874 B.

With regard to JIS1070 materials, the arts which have been proposed by the inventors of the present invention are described in JP 7-81264 A, JP 7-305133 A, JP 8-49034 A, JP 8-73974 A, JP 8-108659 A and JP 8-92679 A.

With regard to Al—Mg type alloys, the arts which have been proposed by the inventors of the present invention are described in JP 62-5080 B, JP 63-60823 B, JP 3-61753 B, JP 60-203496 A, JP 60-203497 A, JP 3-11635 B, JP 61-274993 A, JP 62-23794 A, JP 63-47347 A, JP 63-47348 A, JP 63-47349 A, JP 64-1293 A, JP 63-135294 A, JP 63-87288 A, JP 4-73392 B, JP 7-100844 B, JP 62-149856 A, JP 4-73394 B, JP 62-181191 A, JP 5-76530 B, JP 63-30294 A and JP 6-37116 B. The arts are also described in JP 2-215599 A and JP 61-201747 A.

With regard to Al—Mn type alloys, the arts which have been proposed by the inventors of the present invention are described in JP 60-230951 A, JP 1-306288 A and JP 2-293189 A. In addition, others are also described in JP 54-42284 B, JP 4-19290 B, JP 4-19291 B, JP 4-19292 B, JP 61-35995 A, JP 64-51992 A, JP 4-226394 A, U.S. Pat. No. 5,009,722, U.S. Pat. No. 5,028,276 or the like.

With regard to Al—Mn—Mg type alloys, the arts which have been proposed by the inventors of the present invention are described in JP 62-86143 A and JP 3-222796 A. In addition, others are also described in JP 63-60824 B, JP 60-63346 A, JP 60-63347 A, JP 1-293350 A, EP 223,737, U.S. Pat. No. 4,818,300, GB 1,222,777 or the like.

With regard to Al—Zr type alloys, the arts which have been proposed by the inventors of the present invention are described in JP 63-15978 B and JP 61-51395 A. In addition, others are also described in JP 63-143234 A, JP 63-143235 A, or the like.

With regard to Al—Mg—Si type alloys, the arts are described in GB 1,421,710.

The following method can be, for example, employed to prepare a plate from an aluminum alloy. First, purification treatment is performed on a molten aluminum alloy adjusted to a predetermined alloy component content and is cast according to a normal method. For the purification treatment, in order to remove unnecessary gases such as hydrogen from the molten metal, such treatment is performed as flux treatment; degassing treatment with argon gas, chlorine gas or the like; filtering treatment using a so-called rigid media filter such as ceramics tube filter, ceramics form filter or the like, a filter using alumina flake, alunima ball and the like as filtering media, or a glass cloth filter, or the like; or a combination of degassing treatment with filtering treatment.

It is preferable that purification treatment as aforementioned be performed to prevent defects caused by foreign matter such as non-metal inclusion in the molten metal and oxides, and defects caused by gasses dissolved in the molten metal. Filtering of a molten metal is described in JP 6-57432 A, JP 3-162530 A, JP 5-140659 A, JP 4-231425 A, JP 4-276031 A, JP 5-311261 A, JP 6-136466 A or the like. In addition, degassing of a molten metal is described in JP 5-51659 A, JP 5-49148 A or the like. The inventors of the present invention have also proposed an art regarding degassing of a molten metal in JP 7-40017 A.

Next, the molten metal to which purification treatment is performed as aforementioned is cast. Casting uses either a method by using a solid mold represented by DC casting method and a method by using a drive mold represented by continuous casting method.

In DC casting, a molten metal is solidified at a cooling rate within a range of 0.5 to 30° C./sec. If the cooling rate is less than 0.5° C./sec, many large intermetallic compounds may be formed. When DC casting is performed, an ingot plate 300 to 800 mm in thickness can be produced. Chipping is performed on this ingot according to a usual method as required, and normally, it is cut by 1 to 30 mm of the surface layer, and by 1 to 10 mm preferably. Before and after the chipping, soaking treatment is performed as required. If heat soaking treatment is performed, heat treatment is performed at 450 to 620° C. for 1 to 48 hours so as not to allow intermetallic compounds to become larger. If treatment time is shorter than 1 hour, an effect of soaking treatment may be insufficient.

Thereafter, hot rolling and cold rolling are performed to produce the rolled plate of an aluminum plate. It is appropriate that the starting temperature of hot rolling is 350 to 500° C. Before and after or halfway of hot rolling, intermediate annealing may be performed. The conditions of intermediate annealing are either a heating with a batch type annealer at 280 to 600° C. for 2 to 20 hours, more preferably at 350 to 500° C. for 2 to 10 hours, or a heating with continuous type annealer at 400 to 600° C. for 6 minutes or less, and more preferably at 450 to 550° C. for 2 minutes or less. Crystal structure can be fined by heating an aluminum plate with a continuous type annealer at a temperature rising speed of 10 to 200° C./sec.

With regard to an aluminum plate finished to a plate of a predetermined thickness, for example, 0.1 to 0.5 mm by the aforementioned processes, in addition, the flatness thereof may be improved with correcting device such as a roller leveler and a tension leveler. Although improvement of the flatness may be performed after the aluminum plate is cut into a sheet form, it is preferable that the improvement is performed in a continuous coil form to enhance its productivity. In addition, an aluminum plate is allowed to pass through a slitter line in order to process the aluminum plate to have a predetermined plate width. Further, an oil film may be provided on the surface of the aluminum plate to prevent generation of scratches due to friction between the aluminum plates. An oil film which is volatile or non-volatile is appropriately used as required.

On the other hand, methods to be industrially used as continuous casting method include two-roll method (Hunter method), method with cold rolling represented by 3C method, two-belt method (Hazellet method), a method using a cooling belt and a cooling block represented by Alysuisse caster II model. If continuous casting method is used, solidification develops at a cooling rate in a range of 100 to 1,000° C./sec. Continuous casting method is characterized by that the solid solubility percentage of an alloy component with respect to an aluminum matrix can be increased since it generally has a faster cooling speed than that of DC casting method. With regard to continuous casting method, the arts which have been proposed by the inventors of the present invention are described in JP 3-79798 A, JP 5-201166 A, JP 5-156414 A, JP 6-262203 A, JP 6-122949 A, JP 6-210406 A, JP 6-26308 A and the like.

If continuous casting method is performed, for example, with a method using a chill roll such as Hunter method or the like, since a cast plate of thickness 1 to 10 mm can be directly and continuously produced, resulting in a merit that hot rolling process can be omitted. In addition, if a method with a cooling belt such as Hazellet method or the like is used, a cast plate of thickness 10 to 50 mm can be produced. Generally, a continuously cast rolled-plate of thickness 1 to 10 mm can be obtained by disposing a hot roll just after casting to continuously roll a plate.

These continuously cast rolled plates are subjected to treatments such as cold rolling, intermediate annealing, improvement of flatness, treatment of slit and the like, and are finally finished into a predetermined thickness, for example, 0.1 to 0.5 mm. With regard to intermediate annealing and cold rolling conditions in case where continuous casting method is used, the arts which have been proposed by the inventors of the present invention are described in JP 6-220593 A, JP 6-210308 A, JP 7-54111 A, JP 8-92709 A and the like.

An aluminum plate thus manufactured is expected to have various characteristics as mentioned below.

It is preferable, regarding strength of an aluminum plate, 0.2% proof stress is 140 MPa or more to obtain an elasticity required as a support for a lithographic printing plate. In addition, it is preferable that 0.2% proof stress after heating treatment is performed at 270° C. for 3 to 10 minutes is 80 MPa or more, more preferably 100 Mpa or more in order to obtain an elasticity to some extent even if burning treatment is performed. Particularly, if an aluminum plate requires some elasticity, an aluminum material to which Mg or Mn is added can be adopted. Attachment of a plate to the plate cylinder of a printing machine, however, deteriorates if the elasticity is enhanced. For that reason, the material and an amount of the trace components to be added are appropriately selected in accordance with the application. In connection with this, the arts which have been proposed by the inventors of the present invention are described in JP 7-126820 A, JP 62-140894 A and the like.

Since the crystal texture of an aluminum plate surface may cause a defect in surface quality if chemical graining treatment or electrochemical graining treatment is performed on an aluminum plate, it is preferable that the crystal texture graining on the surface is not too coarse. The width of a particle of the crystal texture on the surface of an aluminum plate should preferably be 200 μm or less, more preferably be 100 μm or less, and further preferably be 50 μm or less. In addition, the length of a particle of the crystal texture should preferably be 5,000 μm or less, more preferably be 1,000 μm or less, and further preferably be 500 μm or less. In connection with these, the arts which have been proposed by the inventors of the present invention are described in JP 6-218495 A, JP 7-39906 A, JP 7-124609 A and the like.

Since a defect in surface quality may take place due to the uneven distribution of an alloy component on the surface of an aluminum plate if chemical graining treatment or electrochemical graining treatment is performed, it is preferable that the distribution of the alloy component is not too uneven on the surface. With regard to these, the arts which have been proposed by the inventors of the present invention are described in JP 6-48058 A, JP 5-301478 A, JP 7-132689 A and the like.

The size or density of intermetallic compounds in an aluminum plate may affect chemical graining treatment or electrochemical graining treatment. In connection with this, the arts which have been proposed by the inventors of the present invention are described in JP 7-138687 A, JP 4-254545 A and the like.

According to the present invention, for use, the aluminum plate as described above can be provided with asperities by laminating rolling, transfer or the like in the final rolling process.

An aluminum plate used in the present invention is a continuous belt-like sheet material or plate material. That is, an aluminum web is acceptable and a sheet material cut into a size or the like corresponding to a presensitized plate to be shipped as a product is also acceptable.

Since a scratch on the surface of an aluminum plate may become a defect when processed into a support for a lithographic printing plate, it is necessary to suppress as much as possible the generation of a scratch at a stage before a surface treatment process to produce a support for a lithographic printing plate is performed. For that reason, it is preferable that an aluminum plate is packed in a stable form and style so as to avoid being scratched.

In case of aluminum web, as a style of packing aluminum, for example, a hard board and a felt sheet are laid over a pallet made of iron, toroidal cardboards are put at both ends of a product, the entire product is wrapped with a polymer tube, a wooden toroid is inserted into the inner diameter section of a coil, the periphery of a coil is covered with a felt sheet, the product is fastened with a hoop iron and the indication is attached to its periphery. In addition, a polyethylene film can be used for packing material, and a needle felt and a hard board can be used for buffer. There are various packing forms besides this one. As long as it provides stable and scratch-free transportation or the like, packing is not limited to this method mentioned above.

The thickness of an aluminum plate used in the present invention is about 0.1 to 0.6 mm, preferably be 0.15 to 0.4 mm, and more preferably be 0.2 to 0.3 mm. This thickness can be appropriately changed according to the size of a printing machine, the size of a printing plate, the request of a user, or the like.

[Presensitized Plate]

A presensitized plate according to the present invention can be obtained by providing image recording layers such as photosensitive layer and thermosensitive layer as exemplified below on a support for a lithographic printing plate according to the present invention.

<Undercoat Layer>

Although a presensitized plate according to the present invention can be obtained by providing the image recording layer on a support for a lithographic printing plate according to the present invention as described above, various undercoat layers may be provided as required before providing the image recording layer. A high-molecular compound having a constituent with an acid group is preferably used among them and particularly, a high-molecular compound having a constituent with onium group together with a constituent with an acid group is preferably used. These compounds may be used either singly or in a combination of two kinds or more mixed.

(High-Molecular Compound having a Constituent with an Acid Group)

For an acid group used in a high-molecular compound having a constituent with an acid group, an acid with acid dissociation index (pKa) of 7 or less is preferable, more preferable are —COOH, —$SO_3H$, —$OSO_3H$, —$PO_3H_2$, —$OPO_3H_2$, —$CONHSO_2$, —$SO_2NHSO_2$— and particularly preferable is —COOH. A constituent with an acid group may be used either singly or in a combination of two kinds or more.

It is preferable that the above high-molecular compounds are polymers in which a principal chain structure is vinyl polymers such as acrylic resins, methacrylic resins or polystyrene, urethane resins, polyesters or polyamides, and it is more preferable that a principal chain structure is vinyl polymers such as acrylic resins, methacrylic resins or polystyrene.

In addition, if the above high-molecular compound has a constituent with onium group, onium groups containing an atom in the 15th group (VB group) or in the 16th group (VIB group) of the periodic table are preferable, onium groups containing nitrogen atom, phosphor atom or sulfur atom are more preferable and onium groups containing nitrogen atom are particularly preferable.

The above high-molecular compound should preferably contain the constituent with onium group as mentioned above of 1 mol % or more and should more preferably contain 5 mol % or more. Adhesion is further improved if the constituent with onium group of 1 mol % or more is contained.

In addition, the above high-molecular compound having a constituent with an acid group should preferably contain a constituent with an acid group of 20 mol % or more and should more preferably contain 40 mol % or more. If a constituent with an acid group of 20 mol % or more is contained, dissolution and removal at the time of alkali development is further accelerated and adhesion is further improved by synergistic effect of an acid group and onium group. In addition, a constituent with onium group may be used either singly or in a combination of two kinds or more.

For the above high-molecular compound used to form an undercoat layer, a mixture of two kinds or more of compounds with different constituents, composition ratio or molecular weights may be used.

Next, shown below are typical examples of high-molecular compounds having a constituent with an onium group together with a constituent with an acid group. In addition, the composition ratios of polymer structures indicate a mole percentage.

TYPICAL EXAMPLES OF POLYMERS

| | STRUCTURES | WEIGHT-AVERAGE MOLECULAR WEIGHT ($M_w$) |
|---|---|---|
| No.1 | 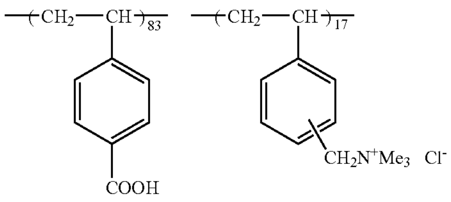 | 32 THOUSANDS |
| No.2 | 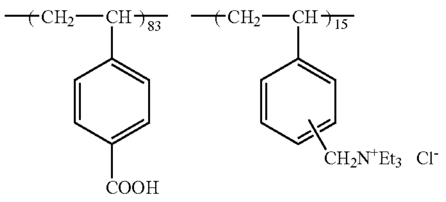 | 28 THOUSANDS |
| No.3 | 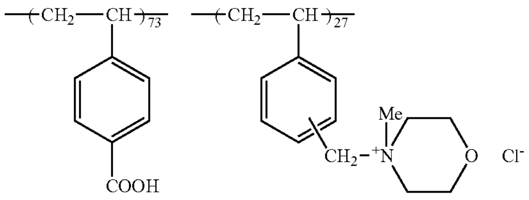 | 26 THOUSANDS |

-continued
TYPICAL EXAMPLES OF POLYMERS
| | STRUCTURES | WEIGHT-AVERAGE MOLECULAR WEIGHT ($M_w$) |
|---|---|---|
| No.4 | 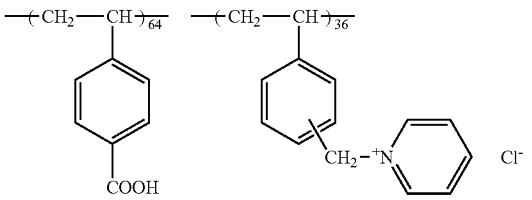 | 41 THOUSANDS |
| No.5 | 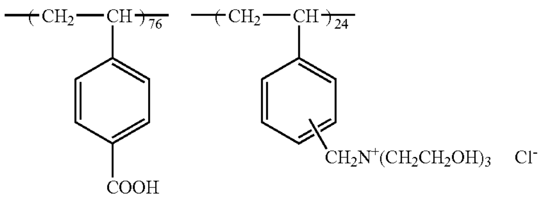 | 11 THOUSANDS |
| No.6 | 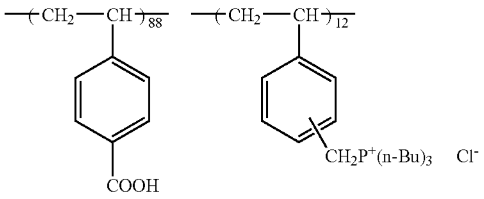 | 17 THOUSANDS |
| No.7 | 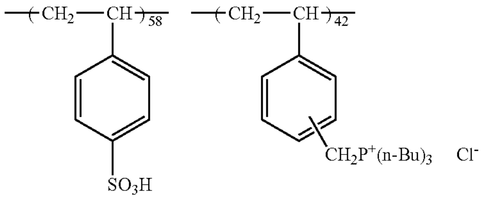 | 36 THOUSANDS |
| No.8 | 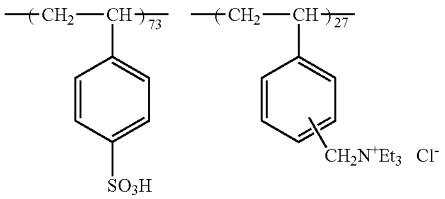 | 22 THOUSANDS |
| No.9 | 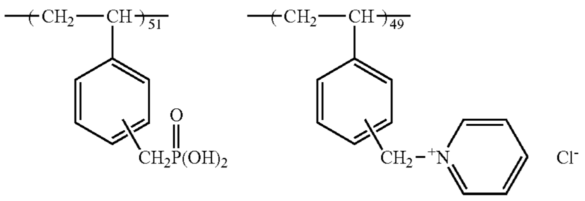 | 44 THOUSANDS |
| No.10 | 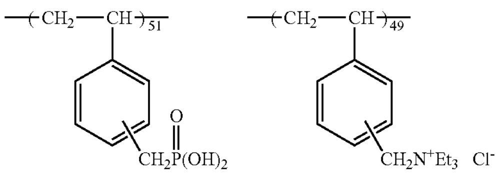 | 19 THOUSANDS |

-continued
| TYPICAL EXAMPLES OF POLYMERS | | |
|---|---|---|
| | STRUCTURES | WEIGHT-AVERAGE MOLECULAR WEIGHT ($M_w$) |
| No.11 | 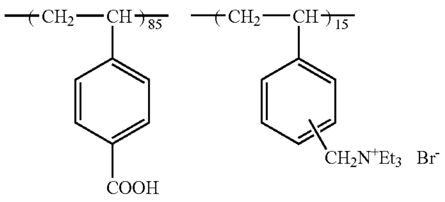 | 28 THOUSANDS |
| No.12 | 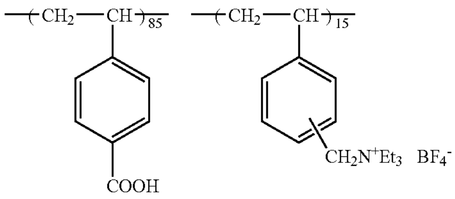 | 28 THOUSANDS |
| No.13 | 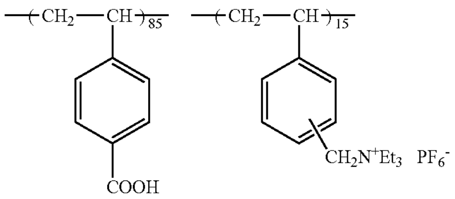 | 28 THOUSANDS |
| No.14 | 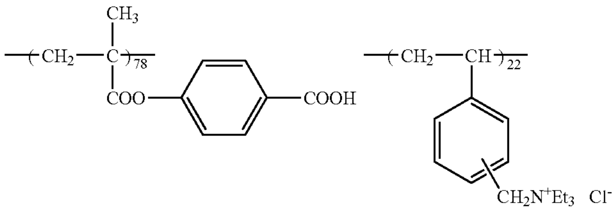 | 34 THOUSANDS |
| No.15 | 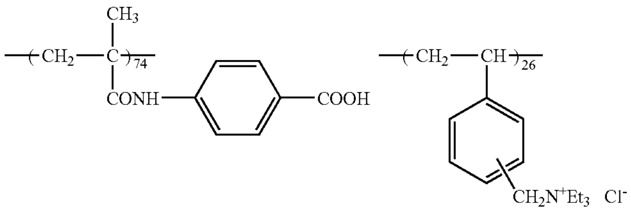 | 42 THOUSANDS |
| No.16 | 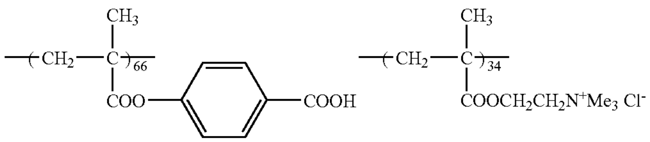 | 13 THOUSANDS |
| No.17 | 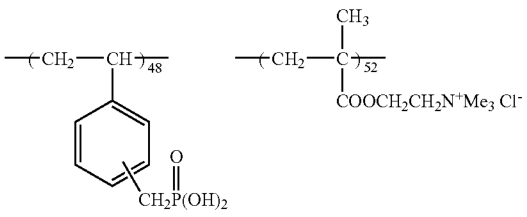 | 15 THOUSANDS |

-continued
TYPICAL EXAMPLES OF POLYMERS
| | STRUCTURES | WEIGHT-AVERAGE MOLECULAR WEIGHT ($M_w$) |
|---|---|---|
| No.18 | 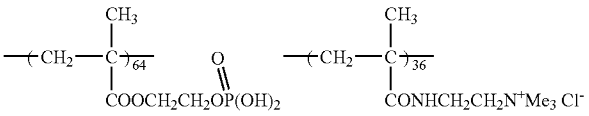 | 46 THOUSANDS |
| No.19 | 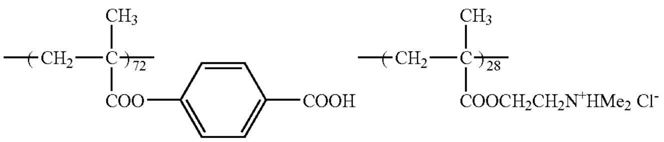 | 34 THOUSANDS |
| No.20 | 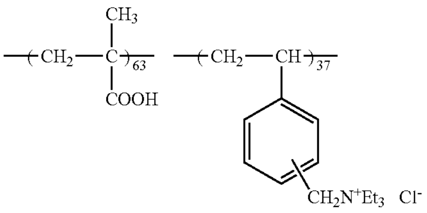 | 63 THOUSANDS |
| No.21 | 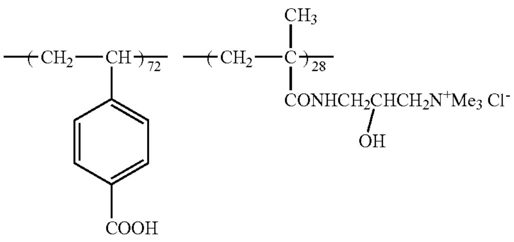 | 25 THOUSANDS |
| No.22 | 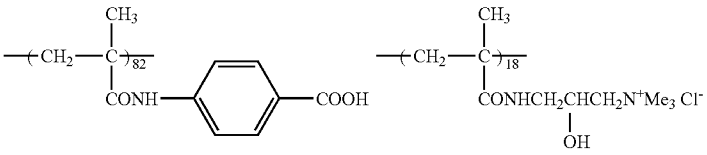 | 25 THOUSANDS |
| No.23 | 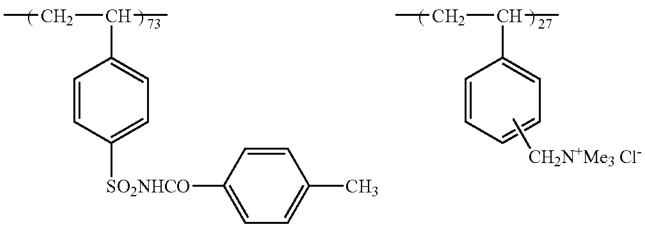 | 33 THOUSANDS |
| No.24 | 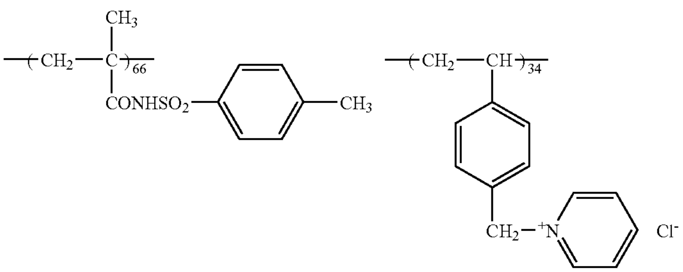 | 41 THOUSANDS |

-continued

TYPICAL EXAMPLES OF POLYMERS

| | STRUCTURES | WEIGHT-AVERAGE MOLECULAR WEIGHT ($M_w$) |
|---|---|---|
| No.25 | 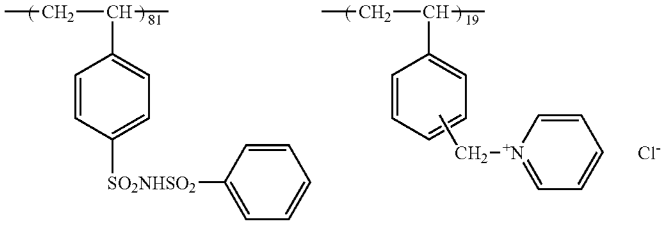 | 14 THOUSANDS |
| No.26 | 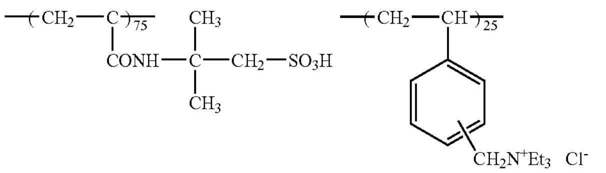 | 22 THOUSANDS |
| No.27 | 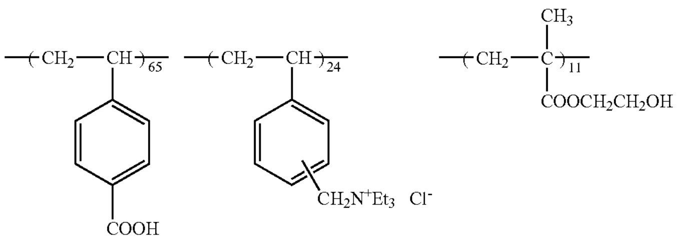 | 23 THOUSANDS |
| No.28 | 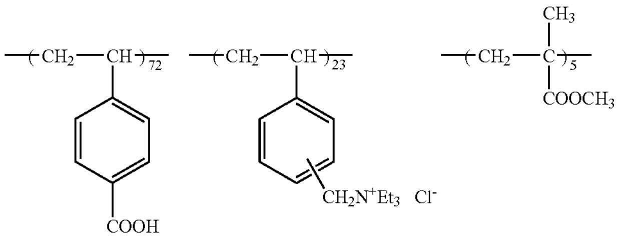 | 47 THOUSANDS |
| No.29 | 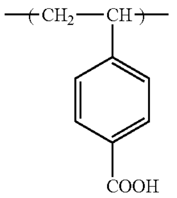 | 35 THOUSANDS |

The above high-molecular compound used to form an undercoat layer can be generally prepared by using a radical chain polymerization process (See "Textbook of Polymer Science" 3rd ed. (1984) F. W. Billmeyer, A Wiley-Interscience Publication).

Although the molecular weight of the above high-molecular compound may stay in a broader range, it is preferable that weight-average molecular weight (Mw) is 500 to 2,000,000 when measuring by light scattering method and more preferable is in a range of 1,000 to 600,000. In addition, although the amount of an unreacted monomer contained in this high-molecular compound may stay in a broader range, preferable is 20 wt% or less and more preferable is 10 wt% or less.

(Production of High-molecular Compound for Formation of Undercoat Layer or the Like)

Next, although the synthesis example of a high-molecular compound having a constituent with an onium group together with a constituent with an acid group is shown by taking up the example of a copolymer (the above No.1) of p-vinylbenzoic acid with vinylbenzyltrimethylammoniumchloride as described above, other high-molecular compounds can be synthesized in a similar process.

p-vinylbenzoic acid (made by Hokko Chemical Industry Co., Ltd.) of 146.9 g (0.99 mol), vinylbenzyltrimethylammoniumchloride of 44.2 g (0.21 mol) and 2-methoxyethanol of 446 g were taken into a three neck flask of 1 L-volume, and they were heated and kept at 75° C. while stirred under the flow of nitrogen gas. Dimethyl 2,2'-azobisisobutyrate of 2.76 g (12 mmol) was added thereto and stirring continued. Two hours later, dimethyl 2,2'-azobisisobutyrate of 2.76 g (12 mmol) was further added thereto and stirring continued. After two-hour stirring, a reactant liquid was left as it stands until the temperature thereof dropped to a room temperature. The reactant liquid was poured into ethyl acetate of 12 L after it was stirred. A deposited solid was filtered and dried. The yield was 189.5 g. For the resultant-solid, the molecular weight was measured with Light Scattering Method to show the weight-average molecular weight ($M_w$) of 32,000.

(Formation of Undercoat Layer)

The undercoat layer can be provided by coating the above high-molecular compound on the support for a lithographic printing plate with various methods.

Taken up as methods for providing the undercoat layer for example are a method for providing an undercoat layer by coating a solution in which the above high-molecular compound is dissolved in organic solvents such as methanol, ethanol and methylethylketone or in a mixture solvent of these solvents or in a mixed solution of these organic solvents with water on the support for a lithographic printing plate and drying the support, and a method for providing the undercoat layer by immersing the support for a lithographic printing plate in a solution in which the above high-molecular compound is dissolved in organic solvents such as methanol, ethanol and methylethylketone or in a mixture solvent of these solvents or in a mixed solution of these organic solvents to allow a high-molecular compound to be adsorbed on the support and subsequently washing with water or the like and drying the support.

In the former method, a solution of the above high-molecular compound with the concentration of 0.005 to 10 wt % can be coated in various methods. For example, either method of bar coater coating, rotation coating, spray coating, curtain coating or the like may be used. In the latter method, a concentration of the solution is 0.01 to 20 wt %, it should preferably be 0.05 to 5 wt %, an immersing temperature is 20 to 90° C., it should preferably be 25 to 50° C., an immersing time is 0.1 second to 20 minutes and it should preferably be 2 seconds to 1 minute.

pH of the above described solution may be controlled by basic materials such as ammonia, triethylamine and potassium hydroxide; inorganic acids such as hydrochloric acid, phosphoric acid, sulfuric acid, and nitric acid and various organic acid materials including organic sulfonic acid such as nitrobenzenesulfonic acid and naphthalenesulfonic acid, organic phosphoric acids such as phenylphosphoric acids and organic carboxylic acids such as benzoic acid, coumalic acid and malic acid; organic acid chlorides such as naphthalenesulfonylchloride and phenylsulfonylchloride and the like. Accordingly the solution can be used at pH in the range of 0 to 12 and can be more preferably used at pH in a range of 0 to 5.

It is appropriate that the coated amount of a high-molecular compound forming the undercoat layer after dried is 2 to 100 $mg/m^2$ and it should preferably be 5 to 50 $mg/m^2$. A sufficient effect may not be obtained if the coated amount is less than 2 $mg/m^2$. In addition, the condition may be the same as above described if it exceeds 100 $mg/m^2$.

<Image Recording Layer>

A photosensitive composition is used for the image recording layer.

Taken up as photosensitive compositions suitably used for the present invention for example are a photosensitive composition of the thermal positive type containing an alkali-soluble high-molecular compound and a photothermal conversion agent (hereinafter referred to as "thermal positive type" with regard to this composition and an image recording layer using the same), a photosensitive composition of the thermal negative type containing a curable compound and a photothermal conversion agent (hereinafter similarly referred to as "thermal negative type"), a photosensitive composition of the photopolymerization type (hereinafter similarly referred to as "photopolymer type"), a photosensitive composition of the negative type containing diazo resin or photo cross-linkable resin (hereinafter similarly referred to as "conventional negative type"), a photosensitive composition of the positive type containing a quinonediazide compound (hereinfater similarly referred to as "conventional positive type") and a photosensitive composition dispensing with an independent development (hereinafter similarly referred to as "development-dispensable type"). Below described are these suitable photosensitive compositions.

<Thermal Positive Type>

Photosensitive Layer

A photosensitive composition of the thermal positive type contains an alkali-soluble high-molecular compound and a photothermal conversion agent. In a image recording layer of the thermal positive, the photothermal conversion agent converts the exposure energy of infrared ray laser and the like into heat, which efficiently cancels an interaction lowering the alkali-solubility of an alkali-soluble high-molecular compound.

Taken up as alkali-soluble high-molecular compound for example are a resin containing an acid group in a molecule and a mixture of two kinds or more of the resin. Particularly preferred is a resin having acid groups such as a phenolic hydroxy group, sulfonamide group ($—SO_2$ NH—R (where, R represents a hydrocarbon group)), and active imino group ($—SO_2$ NHCOR, $—SO_2$ $NHSO_2$ R or $—CONHSO_2R$ (where, R has the similar meaning to the above.)) from the view point of the solubility of the resin to an alkali developer.

Above all, the resin having the phenolic hydroxy group is preferable since it is excellent in image-forming capability in the exposure by an infrared ray laser or the like. For example, novolac resins such as phenol-formaldehyde resin, m-cresol-formaldehyde resin, p-cresol-formaldehyde resin, m-/p-mixed cresol-formaldehyde resin and phenol/cresol (any of m-, p- and m-/p-mixed may be allowed)-mixed-formaldehyde resin (phenolcresolformaldehyde cocondensation resin), are preferably cited. More specifically, polymers described in JP 2001-305722 A (particularly, [0023] to [0042]), polymers containing a repeating unit expressed by a general formula (1) as described in JP 2001-215693 A and polymers as described in JP 2002-311570 A (particularly, [0107]) are preferably used.

As the photothermal conversion agent, from a viewpoint of a recording sensitivity, pigment or dye, which has a light absorbing band in the infrared band ranging from 700 to 1200 nm in wavelength, is preferable. Concretely cited as the dye are azo dye, azo dye in the form of metallic complex salt, pyrazolone azo dye, naphthoquinone dye, anthraquinone dye, phthalocyanine dye, carbonium dye, quinonimine dye, methine dye, cyanine dye, squarylium dyestuff, pyrylium salt, metal thiolate complex (for example, nickel thiolate complex) and the like. Particularly, the cyanine dye is preferable and, for example, the cyanine dye represented by the general formula (I) in JP 2001-305722 A is cited.

A dissolution inhibitor can be contained in the photosensitive composition of the thermal positive type. Suitably taken up as a dissolution inhibitor is one as described in [0053] to [0055] of JP 2001-305722 A.

In addition, it is preferred that a sensitivity regulator, a printing agent to obtain an visible image just after heated by exposure, compounds such as dyes as colorant and a surfactant to improve coating property and treatment stability are contained in the photosensitive composition of the thermal positive type as additives. Compounds as described in [0056] to [0060] of JP.2001-305722 A are preferred for these compounds.

Besides the foregoing aspects, suitably used are photosensitive compositions as described in 2001-305722 A.

In addition, the image recording layer of the thermal positive type may be either a single layer or a two-layer structure.

Suitably taken up as the image recording layer of a two-layer structure (image recording layer of superimposed-type) is a type where a lower layer (hereinafter referred to as “A layer”) excellent in press life and solvent resistance is provided on the side closer to the support and a layer (hereinafter referred to as “B layer”) excellent in an image-forming capability of positive type is provided on the A layer. This type is of high sensitivity and can realize a broader development latitude. The B layer generally contains a photothermal conversion agent. The above-mentioned dyes are suitably taken up as photothermal conversion agents.

Suitably taken up as resins used for the A layer is a polymer which includes a monomer having sulfonamide group, active imino group, phenolic hydroxy group and the like as a copolymerization component since the polymer is excellent in press life and solvent resistance. Suitably taken up as resins used for the B layer is a resin soluble in an alkali aqueous solution having a phenolic hydroxy group.

Various additives can be contained in compositions used for the A and B layers as required besides the aforementioned resins. Concretely, suitably used are various additives as described in [0062] to [0085] of JP 2002-323769 A. In addition, also suitably used are additives as described in [0053] to [0060] of JP 2001-305722 A as aforementioned.

It is preferred that for each component and its content included in the A layer or the B layer, what is described in JP 11-218914 A is followed.

Intermediate Layer

It is preferred that an intermediate layer is provided between the image recording layer of the thermal positive type and the support. Suitably taken up as components contained in the intermediate layer are various organic compounds as described in [0068] of JP 2001-305722 A.

Others

A method for preparing the image recording layer of the thermal positive type and a method for making a plate can use a method as detailedly described in JP 2001-305722 A.

<Thermal Negative Type>

A photosensitive composition of the thermal negative type contains a curable compound and a photothermal conversion agent. An image recording layer of the thermal negative type is a photosensitive layer of the negative type where areas irradiated by an infrared ray laser or the like are cured to form image areas.

Polymerizable Layer

An image recording layer of the polymerizable-type (polymerizable layer) is suitably taken up as the image recording layer of the thermal negative type. The polymerizable layer contains a photothermal conversion agent, a radical generator, a radical polymerizable compound which is a curing compound and a binder polymer. In the polymerizable layer, the infrared rays absorbed by a photothermal conversion agent are converted into heat, which decomposes a radical generator to generate radicals, which allows a radical polymerizable compound to continuously polymerize and a radical polymerizable compound cure.

Taken up as a photothermal conversion agent for example is a photothermal conversion agent contained in the aforementioned the thermal positive type. Taken up as a concrete example of cyanine dye stuff which is particularly preferred are those as described in [0017] to [0019] of JP 2001-133969 A.

Onium salts are suitably taken up as radical generators. Particularly preferred are onium salts as described in [0030] to [0033] of JP 2001-133969 A.

Taken up as a radical polymerizable compound is a compound having at least one, and preferably two or more of the ethylenically unsaturated end bondings.

A linear organic polymer is suitably taken up as a binder polymer. Suitably taken up is a polymer which is soluble or swellable in water or alkalescent aqueous water. Among them, a (meth)acryl resin having unsaturated groups such as allyl group and acryloyl group or benzyl group, and carboxy group at side chain is suitable since the resin is excellent in a balance of layer strength, sensitivity and development property.

For a radical polymerizable compound and a binder polymer, those as detailedly described in [0036] to [0060] of JP 2001-133969 A can be used.

It is preferred that additives (for example, a surfactant to improve coating property) as described in [0061] to [0068] of JP 2001-133969 A are contained in a photosensitive composition of the thermal negative type.

For a method for preparing the polymerization layer and a method for making a plate, the methods as detailedly described in JP 2001-133969 A can be used.

Acid Cross-Linkable Layer

An image recording layer of acid cross-linkable type (acid cross-linkable layer) is suitable taken up also as one of the image recording layers of the thermal negative type. The acid cross-linkable layer contains a photothermal conversion agent, an acid generator by heat, a compound which is cross-linked by an acid that is a curable compound (cross-linking agent) and an alkali-soluble high-molecular compound which may react with a cross-linking agent under the presence of an acid. In the acid cross-linkable layer, infrared rays absorbed by the photothermal conversion agent are converted into heat, which decomposes the acid generator by heat to generate an acid, which allows the cross-linking agent to react with the alkali-soluble high-molecular compound and cure.

The same photothermal conversion agents as used in the polymerizable layer are taken up at this stage.

Taken up as acid generator by heat for example are decomposable compounds by heat such as a photoinitiator for the photopolymerization, a color-turning agent (i.e., dye stuff) and an acid generator for use in micro resist.

Taken up as cross-linking agents for example are aromatic compounds substituted with a hydroxymethyl group or an alkoxymethyl group; compounds having a N-hydroxymethyl group, a N-alkoxymethyl group or a N-acyloxymethyl group; and expoxy compound.

Taken up as an alkali-soluble high-molecular compound for example are novolak resin and polymer having hydroxyaryl group at side chain.

<Photopolymer Type>

A photopolymerization type photosensitive composition contains an addition polymerizable compound, a photopolymerization initiator and a high-molecular binding agent.

Suitably taken up as the addition polymerizable compound is a compound containing ethylenically unsaturated bonding capable of addition polymerization. The compound containing ethylenically unsaturated bonding is a compound having an ethylenically unsaturated end bonding. Concretely, it has a chemical form of monomer, prepolymer, mixtures of these or the like for example. Taken up as examples of the monomer are an ester of an unsaturated carboxylic acid (for example, acrylic acid, methacrylic acid, itaconic acid and maleic acid) and an aliphatic polyalcohol compound and the amide of an unsaturated carboxylic acid and an aliphatic polyamine compound.

In addition, a urethane type addition polymerizable compound is suitably taken up also as an addition polymerizable compound.

As the photopolymerization initiator, a variety of photopolymerization initiators or combined systems of two or more photopolymerization initiators (photo initiation systems) can be appropriately selected for use. For example, initiation systems described in [0021] to [0023] of JP 2001-22079 A are preferable.

Since the high-molecular binding agent needs not only to function as a coating layer forming agent for the photopolymerization type photosensitive composition but also to dissolve the photosensitive layer in an alkali developer, an organic high-molecular polymer that is soluble or swellable in an aqueous solution of alkali is used. As the above-described high-molecular binding agent, the agents described in [0036] to [0063] of JP 2001-22079 A are preferred.

It is preferable to add the additive described in [0079] to [0088] of JP 2001-22079 A (for example, a surfactant for improving the coating property, a colorant, a plasticizer, and a thermal polymerization inhibitor) to the photopolymerization type photosensitive composition of the photopolymer type.

Moreover, it is also preferable to provide an oxygen-shieldable protective layer on the above-described image recording layer of the photopolymer type for preventing the polymerization inhibiting action of oxygen. For example, poly(vinyl alcohol) and a copolymer thereof are cited as a polymer contained in the oxygen-shieldable protective layer.

Furthermore, it is also preferable that an intermediate layer or adhesive layer as described in [0124] to [0165] of JP 2001-228608 A is provided.

<Conventional Negative Type>

A photosensitive composition of the conventional negative type contains diazo resin or photo closs-linkable resin. Among them, a photosensitive composition containing diazo resin and a high-molecular compound that is soluble or swellable in alkali is suitably cited.

Cited as such diazo resin is, for example, a condensate of an aromatic diazonium salt and a compound containing an active carbonyl group such as formaldehyde, and an inorganic salt of diazo resin soluble in organic solvents, which is a reaction product of a condensate of p-diazo phenyl amines and formaldehyde with hexafluorophosphate or tetrafluoroborate. Particularly, a high-molecular diazo compound containing 20 mol % or more of a hexamer or larger, which is described in JP 59-78340 A, is preferable.

For example, copolymer containing, as an essential component, acrylic acid, methacrylic acid, crotonic acid or maleic acid is cited as a binding agent. Specifically, multi-copolymer of monomer such as 2-hydroxyethyl(meth)acrylate, (meth)acrylonitrile and (meth)acrylic acid, which is as described in JP 50-118802 A, and multi-copolymer composed of alkylacrylate, (metha)acrylonitrile and unsaturated carboxylic acid, which is as described in JP 56-4144 A, are cited.

Furthermore, to the photosensitive composition of the conventional negative type, it is preferable to add a compound such as a printing agent, a dye, a plasticizer for imparting the flexibility and abrasion resistance of the coating layer, a compound such as a development accelerator, and a surfactant for improving the coating property, which are described in [0014] and [0015] of JP 7-281425 A.

It is preferable that an intermediate layer containing a high-molecular compound having a constituent with an acid group and a constituent with an onium group, which is described in JP 2000-105462 A, is provided under the photosensitive layer of the conventional negative type.

<Conventional Positive Type>

As a photosensitive composition of the conventional positive type contains quinonediazide compound. Among them, the photosensitive composition containing an o-quinonediazide compound and alkali-soluble high-molecular compound is suitably cited.

Cited as such an o-quinonediazide compound are, for example, an ester of 1,2-naphthoquinone-2-diazide-5-sulfonyl chloride and phenol-formaldehyde resin or cresol-formaldehyde resin, and an ester of 1,2-naphthoquinone-2-diazide-5-sulfonyl chloride and pyrogallol-acetone resin, which is described in U.S. Pat. No. 3,635,709.

Cited as such an alkali-soluble high-molecular compound are, for example, phenol-formaldehyde resin, cresol-formaldehyde resin, phenol-cresol-formaldehyde co-condensed resin, polyhydroxystyrene, copolymer of N-(4-hydroxyphenyl)methacrylamide, carboxy group-containing polymer described in JP 7-36184 A, acrylic resin containing a phenolic hydroxy group as described in JP 51-34711 A, acrylic resin containing a sulfonamide group described in JP 2-866 A, and urethane resin.

Furthermore, it is preferable that a compound such as a sensitivity regulator, a printing agent and a dye, which are described in [0024] to [0027] of JP 7-92660 A, or a surfactant for improving a coating property, which is as described in [0031] of JP 7-92660 A, is added to the photosensitive composition of the conventional positive type.

It is preferred that an intermediate layer which is the same layer suitably used for the conventional negative type is provided under photosensitive layer of the conventional positive type.

<Development-dispensable Type>

Taken up as a photosensitive compositions of the development-dispensable type are a thermoplastic particle polymer type, a microcapsule type, a type containing sulfonic acid-generating polymer and the like. These are all thermosensitive types containing photothermal conversion agents. It is preferred that a photothermal conversion agent is the same dye as used for the aforementioned thermal positive type.

A photosensitive composition of the thermoplastic particle polymer type is a composition in which hydrophobic thermowelding resin particle polymers are dispersed in a hydrophilic polymer matrix. In an image recording layer of the thermoplastic particle polymer type, a hydrophobic thermoplastic particle polymers are welded by a heat generated by exposure and these are welded and adhered to each other to form a hydrophobic area, namely, an image area.

It is preferred that the particles are welded and mutually fuse by heat and more preferred the particle polymers are one that the surface of the particle polymers is hydrophilic and the particle polymers can be dispersed in hydrophilic components such as fountain solution. Concretely, suitably taken up are thermoplastic particle polymers as described in Research Disclosure No.33303 (Published in January, 1992), JP 9-123387 A, JP 9-131850 A, JP 9-171249 A, JP 9-171250 A and EP 931,647 A. Preferred are polystyrene and poly methyl methacrylate among them. Taken up as particle polymers having a hydrophilic surface for example are ones that polymers per se are hydrophilic; and polymers with the surface made hydrophilic by allowing hydrophilic compounds such as poly (vinyl alcohol) and polyethylene glycol to be adsorbed to the surface of a particle polymer.

Preferred is a particle polymer having a reactive functional group.

As a photosensitive composition of the microcapsule type, one described in JP 2000-118160 A and a microcapsule type containing a compound having a thermoreactive functional group as described in JP 2001-277740 A are preferably cited.

As a sulfonic acid-generating polymer for use in a photosensitive composition of the type containing the sulfonic acid-generating polymer, for example, polymer having a sulfonic acid ester group, a disulfonic group or a sec- or tert-sulfonamide group in the side chain described in JP 10-282672 A is cited.

The hydrophilic resin can be contained in the thermosensitive layer of the development-dispensable type, and thus, not only the on-machine development property would be improved, but also the coating layer strength of the thermosensitive layer itself would be improved. Preferred as hydrophilic resins are, for example, resins having hydrophilic groups such as hydroxy group, carboxy group, hydroxyethyl group, hydroxypropyl group, amino group, aminoethyl group, aminopropyl group and carboxymethyl group and hydrophilic sol-gel conversion type binding resins.

The image recording layer of the development-dispensable type dispenses with an independent development process and development processing can be performed on a printing press. For a method for preparing the image recording layer of the development-dispensable type and a method for making plate and printing, the methods as detailedly described in JP 2002-178655 A can be used.

<Backcoat Layer>

A backcoat layer can be provided on the back side of the presensitized plate according to the present invention thus obtained by providing various image recording layers on the support for a lithographic printing plate according to the present invention if required in order to prevent possible scratches on image recording layers, for example, when superimposed, or the like.

Preferably taken up as backcoat layers for example are the coating layer containing an organic high-molecular compound as described in JP 5-45885 A and the coating layer containing a metallic compound obtainable by hydrolyzing the organic metal compounds or the inorganic metal compounds to allow them to be polymerized and condensed as described in JP 6-35174 A.

Among these coating layers, the coating layers which contain alkoxy compound of silicon such as $Si(OCH_3)_4$, $Si(OC_2H_5)_4$, $Si(OC_3H_7)_4$ and $Si(OC_4H_9)_4$ are preferable since they are easy to be purchased for the cheapness of the raw material, and are excellent in development resistance property.

<Method of Producing a Presensitized Plate>

Usually, the respective layers of the image recording layer and the like can be produced by coating a coating liquid obtained by dissolving the foregoing components into a solvent on the support for the lithographic printing plate.

Cited as solvents used herein are ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolan, γ-butyrolactone, toluene, water and the like. However, the present invention is not limited to this. These solvents are used singly or mixedly.

It is preferable that the concentration of the foregoing components (entire solid part) in the solvent range from 1 to 50 wt %.

Various coating methods can be used. For example, bar coater coating, rotation coating, spray coating, curtain coating, dip coating, air knife coating, blade coating, roll coating and the like can be cited.

<Method of Producing a Lithographic Printing Plate>

The presensitized plate of the present invention is made into a lithographic printing plate by various treatment methods in accordance with the kind of the image recording layer.

In general, image exposure is carried out. Cited as light sources of active rays for use in the image exposure are, for example, a mercury lamp, a metal halide lamp, a xenon lamp and a chemical lamp. As laser beams, for example, helium-neon (He—Ne) laser, argon laser, krypton laser, helium-cadmium laser, KrF excimer laser, semiconductor laser, YAG laser and YAG-SHG laser are cited.

When the image recording layer is of any of the thermal types, the conventional types and the photopolymer type, it is preferable that the presensitized plate is developed by use of a developer after the exposure to obtain the lithographic printing plate. Although a preferable developer for use in the presensitized plate of the present invention is not particularly limited as long as the developer is an alkali developer, an alkali aqueous solution that does not substantially contain an organic solvent is preferable. Moreover, the development can be carried out by use of a developer that does not substantially contain alkali metal silicate. The developing method using the developer that does not substantially contain the alkali metal silicate is described in detail in JP 11-109637 A, and the contents described in JP 11-109637 A can be used. Moreover, the presensitized plate of the present invention can be developed by use of a developer that contains the alkali metal silicate.

Above all, one of preferred aspects includes a method of producing a lithographic printing plate (processing method) according to the present invention where a lithographic printing plate is obtained by performing a development with a developer containing substantially no alkali metal silicates after a presensitized plate of the present invention is exposed if the image recording layer is either of thermal positive type, conventional positive type or photopolymer type. Described below is a method of producing a lithographic printing plate according to the present invention.

A method of producing a lithographic printing plate according to the present invention is characterized by developing a presensitized plate according to the present invention with a developer containing substantially no alkali metal silicates.

Although alkali metal silicate treatment is not performed on a support for a lithographic printing plate, if a presensitized plate according to the present invention is developed with a developer containing substantially no alkali metal silicates after exposed, a lithographic printing plate excellent in scum resistance after being left can be obtained. Moreover, it is acceptable that alkali metal silicate treatment is performed on the support for a lithographic printing plate.

In addition, there are no problems that non-image areas are whitened at the time of development or scum or sludge generates at the time of development since a developer used contains substantially no alkali metal silicates with the method of producing a lithographic printing plate according to the present invention. In addition, it can prevent problems that a solid caused by $SiO_2$ is likely to deposit, a gel caused by $SiO_2$ is produced in a neutralization treatment when disposing of a wastewater of a developer or the like.

Moreover, a method of performing a development with a developer containing substantially no alkali metal silicates is described in detail in JP 11-109637 A and the contents described in JP 11-109637 A can be used in the present invention.

Although a preferred developer used in the method of producing a lithographic printing plate according to the present invention is not particularly limited as long as the developer contains substantially no alkali metal silicates, it is preferable that it is an alkali aqueous solution containing substantially no organic solvent. However, it may contain an organic solvent as required.

In addition, it is preferable that this developer contains saccharaides. For example, cited is a developer that has at least one compound selected from non-reducing sugar and at least one kind of base, as principal components and that is at pH 9.0 to 13.5.

Furthermore, a developer can contain various surfactants to promote development property, diffuse development scum and improve ink receptivity in the image areas of a lithographic printing plate as required. In the present invention, either of anionic surfactant, cationic surfactant, nonionic surfactant or amphoteric surfactant can be used. In addition, a developer can contain various development stabilizers. Moreover, a developer can also contain a reducing agent to prevent a lithographic printing plate from being scummed. Especially, it is effective to develop a presensitized plate having a negative type photosensitive layer containing a photosensitive diazonium salt compound. In addition, a developer can contain an organic carboxylic acid.

EXAMPLE

Although the present invention will be described in detail with reference to examples, the present invention is not limited to these examples.

<Example of the First Aspect According to the Present Invention>

1-1. Preparation of Presensitized Plates

Example 1-1

<Aluminum Plate>

Molten metal was prepared by using an aluminum alloy containing Si: 0.06 wt %, Fe: 0.30 wt %, Cu: 0.005 wt %, Mn: 0.001 wt %, Mg: 0.001 wt %, Zn: 0.001 wt % and Ti: 0.03 wt %, and containing Al and inevitable impurities for the remaining portion. After molten metal treatment and filtering were performed, an ingot having a thickness of 500 mm and a width of 1200 mm was made by a DC casting method. After the surface was chopped to have an average thickness of 10 mm with a surface chipper, the ingot was held at 550° C. for about 5 hours for soaking. When the temperature dropped to 400° C., the ingot was formed into a rolled plate having a thickness of 2.7 mm by using a hot rolling mill. Further, after the heat treatment was performed at 500° C. with a continuous annealing machine, the roller plate was finished into an aluminum plate having a thickness of 0.24 mm with cold rolling to obtain an aluminum plate of JIS 1050 material. This aluminum plate was processed to have a width of 1030 mm, and surface treatment described below was continuously carried out.

<Surface Treatment>

Various surface treatments of (a) to (i-1) mentioned below were continuously performed. Furthermore, a liquid squeezing was performed by a nip roller after each treatment and water washing.

(a) Mechanical Graining Treatment

Mechanical graining treatment was carried out by rotating roller nylon brushes while supplying suspension containing abrasive (pumice) and water (specific gravity: 1.12) as abrasive slurry liquid to the surface of the aluminum plate, using device shown in FIG. 1. In FIG. 1, 1 represents an aluminum plate, 2 and 4 represent roller brushes, 3 represents an abrasive slurry liquid, and 5, 6, 7 and 8 represent supporting rollers. The abrasive had average particle size of 40 μm and the maximum particle size of 100 μm. A material for the nylon brush was 6–10 nylon, having a bristle length of 50 mm, and a bristle diameter of 0.3 mm. The Nylon brush was made by boring holes in a ϕ 300 mm stainless cylinder and densely implanting bristles therein. Three of such rotary brushes were prepared. Each distance between two supporting rollers (ϕ200 mm) in the lower part of the brush was 300 mm. Each brush roller was pressed until a load of a driving motor for rotating the brush reached plus 7 kW with respect to the load before the brush roller was pressed to the aluminum plate. The rotating direction of each brush was the same as the moving direction of the aluminum plate. The number of rotations of the brushes was 200 rpm.

(b) Alkali Etching Treatment

Etching treatment was performed on the aluminum plate obtained in the foregoing manner by spraying an aqueous solution containing 2.6 wt % of sodium hydroxide and 6.5 wt % of aluminum ion at a temperature of 70° C. and the aluminum plate was dissolved by 10 $g/m^2$. After that, washing was performed by spraying water.

(c) Desmutting Treatment

The aluminum plate was subjected to spray desmutting treatment in aqueous solution of nitric acid 1 wt % (containing 0.5 wt % of aluminum ions) at 30° C., and then washed by spraying water. For the aqueous solution of nitric acid used in the desmutting treatment, waste solution generated in a process of electrochemical graining treatment carried out by using an alternating current in an aqueous solution of nitric acid to be described later was utilized.

(d) Electrochemical Graining Treatment

Electrochemical graining treatment was continuously performed by using an alternating current voltage of 60 Hz. Electrolyte in this case was aqueous solution of nitric acid 10.5 g/L (containing 5 g/L of aluminum ion and 0.007 wt % of ammonium ion) at a temperature of 50° C. An alternating current supply waveform was like that shown in FIG. 2. With the time TP necessary for a current value to reach its peak from zero set as 0.8 msec, and duty ratio set at 1:1, and by using a trapezoidal wave, the electrochemical graining treatment was performed while a carbon electrode was set as a counter electrode. A ferrite was used for an auxiliary anode. An electrolytic cell used is shown in FIG. 3.

The current density was 30 A/dm$^2$ at a current peak value. The total of the quantity of electricity was 220 C/dm$^2$ when the aluminum plate was at the anode side. An amount equivalent to 5% of a current flowing from the power supply was shunted to an auxiliary anode.

The aluminum plate was then washed by spraying water.

(e) Alkali Etching Treatment

Etching treatment was performed on an aluminum plate by straying an aqueous solution containing 26 wt % of sodium hydroxide and 6.5 wt % of aluminum ion at 60° C. The aluminum plate was dissolved by 1.0 g/m$^2$, a smut component mainly containing aluminum hydroxide generated in the previous stage of the electrochemical graining treatment performed by using alternating current was removed, and edge portions of formed pits were dissolved to be made smooth. Then, the aluminum plate was washed by spraying water.

(f) Desmutting Treatment

The aluminum plate was subjected to spray desmutting treatment in aqueous solution of nitric acid 15 wt % (containing 4.5 wt % of aluminum ions) at 30° C., and then washed by spraying water. For the aqueous solution of nitric acid used in the desmutting treatment, waste solution generated in the process of the electrochemical graining treatment carried out by using an alternating current of a nitric acid was utilized.

(g) Anodizing Treatment

By using anodizing device with a structure shown in FIG. 4, anodizing treatment was carried out. Electrolyte supplied for each of first and second electrolytic portions was sulfuric acid. For each electrolyte, the concentration of sulfuric acid was 170 g/L (containing 0.5 wt % of aluminum ion) at a temperature of 38° C. Then, washing by spraying water was carried out. The final amount of an anodized layer was 2.7 g/m$^2$.

(h) Hydrophilic Treatment

Hydrophilic treatment (alkali metal silicate treatment) was carried out by dipping the aluminum plate into a treatment cell with the aqueous solution containing 1 wt % of III-sodium silicate at a temperature of 20° C. for 10 seconds. Then, the plate was washed by water spraying using well water.

(i-1) Treatment with Liquid Containing Rare-Earth Element Ion

Treatment with a liquid containing a rare-earth element ion was carried out by dipping the aluminum plate into a treatment cell with the aqueous solution containing 1 g/L of cerium acetate at a temperature of 60° C. for 10 seconds. Then, the plate was washed by water spraying using well water to obtain a support for a lithographic printing plate.

As described below, the presensitized plate was obtained by providing image recording layer A on the support for a lithographic printing plate obtained as mentioned above.

<Formation of Image Recording Layer A>

Undercoat solution containing a composition described below was coated on the support for a lithographic printing plate and dried at a temperature of 80° C. for 15 seconds, to form a coating layer (undercoat layer). The coated amount after drying was 20 mg/m$^2$.

| <Composition of undercoat solution> | |
|---|---|
| High-molecular compound described below | 0.3 g |
| Methanol | 100 g |
| Water | 1 g |

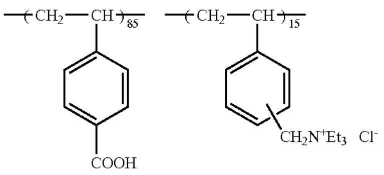

MOLECULAR WEIGHT 28,000

Subsequently, thermosensitive layer coating solution A having a composition described below was prepared and, the thermosensitive coating solution A was coated over the undercoated support for a lithographic printing plate, so that the amount after drying (the coated amount of thermosensitive layer) meets 1.7 g/m$^2$. Then, drying was carried out in order to form thermosensitive layer (thermal positive type image recording layer A). In this way, the presensitized plate was obtained.

| <Composition of thermosensitive layer coating solution A> | |
|---|---|
| Novolac resin (m-cresol/p-cresol = 60/40, weight-average molecular weight 7,000, unreacted cresol 0.5 wt % contained) | 1.0 g |
| Cyanine dye A expressed by the following structural formula | 1.0 g |
| Tetrahydro phthalic anhydride | 0.05 g |
| p-toluensulfonic acid | 0.002 g |
| A compound formed by converting a counterion of ethylviolet into 6-hydroxy-β-naphthalenesulfonic acid | 0.02 g |
| Fluorine-containing surfactant (Megaface F-177 made by Dainippon Ink And Chemicals, Incorporated) | 0.05 g |
| Methylethylketone | 12 g |

CYANINE DYE A

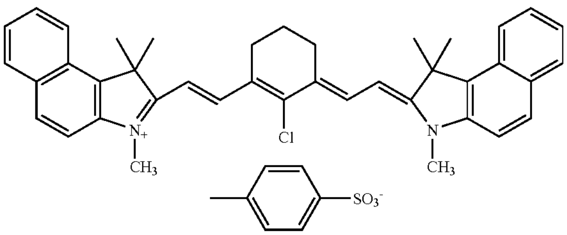

Examples 1-2 to 1-19

Presensitized plates were obtained with the same methods as in Example 1-1, except that the concentration of the aqueous solution, the temperature of the aqueous solution and the dipping time in (h) mentioned above, and the kind of the rare-earth element compound, the temperature of the aqueous solution and the dipping time in (i-1) mentioned above were changed as shown in Table 2.

Example 1-20

A presensitized plate was obtained with the same method as in Example 1-13, except that (a) mentioned above was not performed and (j), (k) and (l) mentioned below were performed in place of (d), (e) and (f) mentioned above.

(j) Electrochemical Graining Treatment

Electrochemical graining treatment was continuously performed by using an alternating current voltage of 60 Hz. Electrolyte in this case was aqueous solution of hydrochloric acid 7.5 g/L (containing 5 g/L of aluminum ion) at a temperature of 35° C. An alternating current supply waveform was like that shown in FIG. 2. With the time TP necessary for a current value to reach its peak from zero set as 0.8 msec, and duty ratio set at 1:1, and by using a trapezoidal wave, the electrochemical graining treatment was performed while a carbon electrode was set as a counter electrode. A ferrite was used for an auxiliary anode. An electrolytic cell used is shown in FIG. 3.

The current density was 25 $A/dm^2$ at a current peak value. The total of the quantity of electricity was 500 $C/dm^2$ when the aluminum plate was at the anode side. An amount equivalent to 5% of a current flowing from the power supply was shunted to an auxiliary anode.

Then, the aluminum plate was washed by spraying water.

(k) Alkali Etching Treatment

Etching treatment was performed on an aluminum plate by straying an aqueous solution containing 26 wt % of sodium hydroxide and 6.5 wt % of aluminum ion at 32° C. The aluminum plate was dissolved by 0.5 $g/m^2$, a smut component mainly containing aluminum hydroxide generated in the previous stage of the electrochemical graining treatment performed by using alternating current was removed, and edge portions of formed pits were dissolved to be made smooth. Then, the aluminum plate was washed by spraying water.

(1) Desmutting Treatment

The aluminum plate was subjected to spray desmutting treatment in aqueous solution of sulfuric acid 25 wt % (containing 0.5 wt % of aluminum ions) at 60° C., and then washed by spraying water.

Examples 1-21 to 1-23

Presensitized plates were obtained with the same methods as in Example 1-1, except that (m), (n) and (o) mentioned below were performed between (f) and (g) mentioned above, and the kind of the rare-earth element compound in (i-1) mentioned above were changed as shown in Table 2.

(m) Electrochemical Graining Treatment

Electrochemical graining treatment was continuously performed by using an alternating current voltage of 60 Hz. Electrolyte in this case was aqueous solution of hydrochloric acid 2.5 g/L (containing 5 g/L of aluminum ion) at a temperature of 35° C. An alternating current supply waveform was like that shown in FIG. 2. With the time TP necessary for a current value to reach its peak from zero set as 0.8 msec, and duty ratio set at 1:1, and by using a trapezoidal wave, the electrochemical graining treatment was performed while a carbon electrode was set as a counter electrode. A ferrite was used for an auxiliary anode. An electrolytic cell used is shown in FIG. 3.

The current density was 25 $A/dm^2$ at a current peak value. The total of the quantity of electricity was 30 $C/dm^2$ when the aluminum plate was at the anode side.

Then, the aluminum plate was washed by spraying water.

(n) Alkali Etching Treatment

Etching treatment was performed on an aluminum plate by straying an aqueous solution containing 26 wt % of sodium hydroxide and 6.5 wt % of aluminum ion at 32° C. The aluminum plate was dissolved by 0.10 $g/m^2$, a smut component mainly containing aluminum hydroxide generated in the previous stage of the electrochemical graining treatment performed by using alternating current was removed, and edge portions of formed pits were dissolved to be made smooth. Then, the aluminum plate was washed by spraying water.

(o) Desmutting Treatment

The aluminum plate was subjected to spray desmutting treatment in aqueous solution of sulfuric acid 25 wt % (containing 0.5 wt % of aluminum ions) at 60° C., and then washed by spraying water.

Examples 1-24 to 1-26

Presensitized plates were obtained with the same methods as in Example 1-1, except that (m), (n) and (o) mentioned above were performed between (f) and (g) mentioned above, the concentration of the aqueous solution, the temperature of the aqueous solution and the dipping time in (h) mentioned above, the dipping time in (i-1) mentioned above and the kind of the image recording layer were changed as shown in Table 2.

Comparative Examples 1-1 to 1-3

Presensitized plates were obtained with the same methods as in Example 1-1, except that compounds shown in Table 2 which were not rare-earth element compounds were used in place of cerium acetate in (i-1) mentioned above.

Comparative Example 1-4

A presensitized plates was obtained with the same methods as in Example 1-1, except that (i-1) mentioned above was not performed.

Comparative Examples 1-5 and 1-6

Presensitized plates were obtained with the same methods as in Example 1-1, except that (m), (n) and (o) mentioned above were performed between (f) and (g) mentioned above, compounds shown in Table 2 which were not rare-earth element compounds were used in place of cerium acetate in (i-1) mentioned above, and the kind of the image recording layer was changed as shown in Table 2.

Comparative Example 1-7

A presensitized plates was obtained with the same methods as in Example 1-1, except that (m), (n) and (o) mentioned above were performed between (f) and (g) mentioned above, (i-1) mentioned above was not performed and the kind of the image recording layer was changed as shown in Table 2.

Formation of image recording layers B, C and D were performed as described below.

<Formation of Image Recording Layer B>

Thermosensitive layer coating solution B having a composition described below was prepared and was applied with a wire bar to the support for a lithographic printing plate, and a thermosensitive layer (photopolymerizable layer) was formed by drying the support at 115° C. for 45 seconds with a hot-air drying equipment to obtain a presensitized plate. The coated amount after drying was 1.2 g/$m^2$.

| <Composition of thermosensitive layer coating solution B> | |
|---|---|
| Infrared absorbent IR-6 expressed by the following formula | 0.08 g |
| Radical generator IO-6 expressed by the following formula | 0.30 g |
| Dipentaerythritol hexaacrylate | 1.00 g |
| Copolymer of mole rate 80:20 of allylmethacrylate to methacrylic acid (weight average molecular weight 120,000) | 1.20 g |
| Naphthalenesulfonate of victoria pure blue | 0.04 g |
| Fluorine-containing surfactant (Megaface F-176 made by Dainippon Ink And Chemicals, Incorporated) | 0.04 g |
| Methylethylketone | 9.0 g |
| Methanol | 10.0 g |
| 1-methoxy-2-propanol | 4.0 g |
| 3-methoxy-1-propanol | 4.0 g |

IR-6

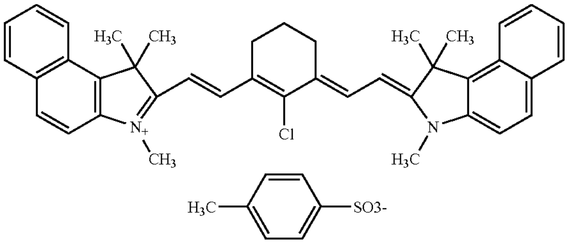

-continued

<Composition of thermosensitive layer coating solution B>

IO-6

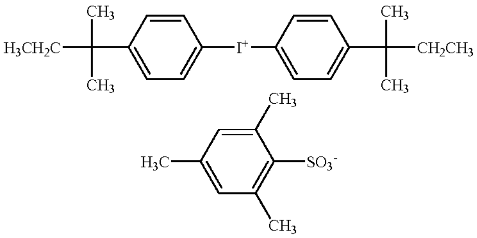

<Formation of Image Recording Layer C>

Solution that a polymer expressed by the following formula U-1 (number average molecular weight: 10,000) was dissolved in a mixture solution of water/methanol=5/95 (weight ratio) was coated onto the support for a lithographic printing plate obtained above, and an undercoat layer (adhesive layer) was formed by drying the support at 80° C. for 30 seconds (Sol-Gel undercoat) The coated amount of an undercoat layer after drying was 10 mg/$m^2$.

U-1

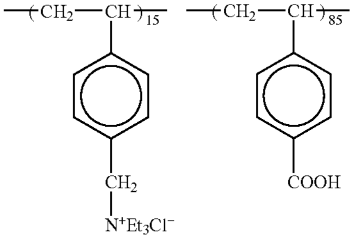

Furthermore, the high-sensitivity photopolymerizable composition P-1 of the following constitution was prepared, this composition was applied to the undercoated support for a lithographic printing plate such that a coated amount after being dried (coated amount of photosensitive layer) becomes 1.5 g/$m^2$, a photosensitive layer was formed by drying the support at 100° C. for one minute.

<Photopolymerizable composition P-1>

| <Photopolymerizable composition P-1> | |
|---|---|
| Compound containing ethylenic unsaturated bond expressed by the following formula A1 | 1.5 parts by weight |
| Linear organic polymer (high-molecular binder) expressed by the following formula B1 | 2.0 parts by weight |
| Sensitizer expressed by the following formula C1 | 0.15 parts by weight |
| Photopolymeric initiator expressed by the following formula D1 | 0.2 parts by weight |
| Dispersed substance of ε-phthalocyanine expressed by the following formula F1 | 0.02 parts by weight |
| Fluorine-containing nonionic surfactant (Megaface F-177 made by Dainippon Ink And Chemicals, Incorporated) | 0.03 parts by weight |
| Methylethylketone | 9.0 parts by weight |
| Propyleneglycol monomethylether acetate | 7.5 parts by weight |
| Toluene | 11.0 parts by weight |

-continued

<Photopolymerizable composition P-1>

A1

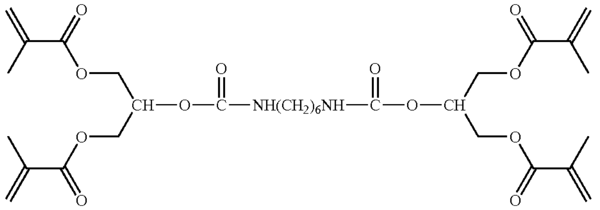

B1

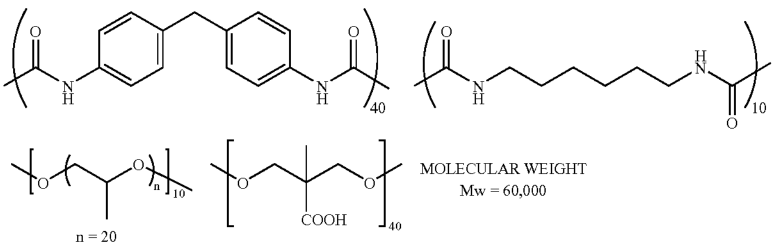

MOLECULAR WEIGHT Mw = 60,000

C1

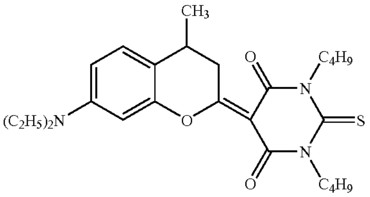

D1

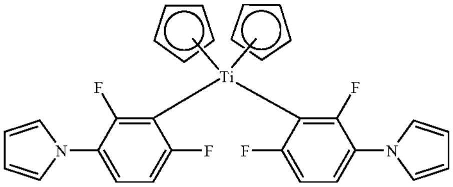

F1

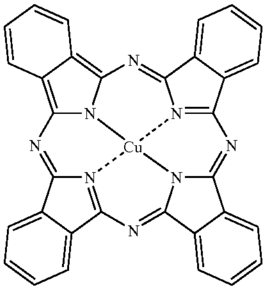

An aqueous solution of polyvinyl alcohol (degree of saponification 98 mol %, degree of polymerization 500) 3 wt % was coated onto this photosensitive layer such that a coated amount after drying meets 2.5 g/$m^2$, a photosensitive layer (photopolymer negative type image recording layer) was formed by drying the support at 120° C. for 3 min. and thus, a presensitized plate was obtained.

<Formation of Image Recording Layer D>

Thermosensitive layer coating solution D having a composition described below was applied with a wire bar to the support for a lithographic printing plate obtained above such that a coated amount after drying (coated amount of thermosensitive layer) meets 0.8 g/$m^2{}_1$ and a thermosensitive layer (image recording layer of the development-dispensable type) was formed by drying the support at 90° C. for 2 minutes to obtain a presensitized plate.

| <Composition of thermosensitive layer coating solution D> | |
|---|---|
| Water | 70 g |
| Microcapsules, the shells thereof can be broken by heat, obtained in Synthesis example (1) described below | 5 g (solid content) |
| Polyhydroxyethyl acrylate | 0.5 g |
| p-diazodiphenylamine sulfate | 0.3 g |
| Dispersed substance of ε-phthalocyanine expressed by the foregoing formula F1 | 0.3 g |

<Synthesis Example (1)>

An oil phase component was prepared by dissolving xylylene dusocyanate 40 g, trimethylolpropane diacrylate 10 g, copolymer of allylmethacryalte and butylmethacrylate (mole ratio 60/40) 10 g and surfactant (Paionin A41C, Takemoto Oil & Fat Co., Ltd.) 10 g in ethyl acetate 60 g. On the other hand, 4 wt % aqueous solution of polyvinyl alcohol 120 g (PVA 205, Kuraray Co., Ltd.) was prepared, forming a water phase component. The oil phase and water phase components were introduced to a homogenizer, and emulsified at 10,000 rpm. Then, water 40 g was added, stirring was carried out at a room temperature for 30 minutes, then stirring was further carried out at 40° C. for 3 hours, and then microcapsule dispersed liquid was obtained. Solid content of the obtained microcapsule dispersed liquid was 20 wt %, and an average particle size of the microcapsules was 0.5 μm.

1-2. Exposure and Development Treatment

Image exposure and development treatment were performed on each presensitized plate obtained above in the following methods corresponding to image recording layers and a lithographic printing plate was obtained.

(1) In a Case of Thermal Positive Type Image Recording Layer A

Image exposure was performed on the presensitized plate at a main scanning speed of 5 m/sec and printing plate energy of 140 mJ/cm$^2$, with CREO Inc.-made TrendSetter 3244 equipped with a semiconductor laser of output 500 mW, wavelength 830 nm and beam diameter 17 μm (l/e$^2$).

Thereafter, development treatment was performed on the presensitized plate with an alkali developer in which 1 g of $C_{12}H_{25}N(CH_2CH_2COONa)_2$ was added to an aqueous solution 1L containing 5.0 wt % of potassium salt having D-sorbitol/potassium oxide $K_2O$ which was a combination of non-reducing sugar and base and OLFINE AK-02 (made by Nissin Chemical Industry Co., Ltd.) 0.015 wt %. This treatment was performed at a development temperature of 25° C. for 12 seconds with an automatic processor PS900NP (made by Fuji Photo Film Co., Ltd.) filled with the aforementioned alkali developer. After the development treatment was over, water washing treatment was then performed, treatment with gum (GU-7 (1:1)) or the like was performed, and a lithographic printing plate with plate making completed was obtained.

(2) In a Case of Thermal Negative Type Image Recording Layer B

The presensitized plate was subjected to exposure with CREO Inc.-made TrendSetter 3244 VFS, having a water-cooled 40 W infrared semiconductor laser loaded under a condition that output was 9 W, revolutionary speed of an outer surface drum was 210 rpm, printing plate energy was 100 mJ/cm$^2$ and resolution was 2400 dpi.

Thereafter, development treatment was performed on the presensitized plate with an automatic processor STABLON 900 N (Fuji Photo Film Co., Ltd.). Water diluted solution (1:1) of DN-3C (Fuji Photo Film Co., Ltd.) was used as a developer. The temperature of developing bath was 30° C. Water diluted solution (1:1) of FN-6 (Fuji Photo Film Co., Ltd.) was used as a finisher.

(3) In a Case of Photopolymer Type Image Recording Layer C

Scanning exposure of a solid image and 1 to 99% dot image (in every 1 %) was performed on the presensitized plate at an exposure amount of 100 μJ/cm$^2$ and 175 scanning lines/inch at 4,000 dpi with FD•YAG laser (Plate Jet 4 made by Cymbolic Sciences, Inc.). After exposure, preheating was performed under a condition that a printing plate reached a temperature of 100° C.

Standard treatment was then performed with an automatic processor (LP-850P2 made by Fuji Photo Film Co., Ltd.) filled with developer 1 of the following composition (pH 11.5 (at 25° C.) and electric conductivity 5 mS/cm) and finishing gum solution FP-2W (made by Fuji Photo Film Co., Ltd.). The temperature of the developer was 30° C., and the dipping time in the developer was about 15 seconds.

<Compositions of Developer 1>

| <Composition of developer 1> | |
|---|---|
| Potassium hydroxide | 0.15 g |
| Polyoxyethylenephenylether (number of constitutional repeating unit of polyoxyethylene chain: n = 13) | 5.0 g |
| Chelating agent (Chelest 400 made by Chelest Corporation) | 0.1 g |
| Water | 94.75 g |

(4) In a Case of Development-Dispensable Type Image Recording Layer D

The presensitized plate was subjected to exposure with CREO Inc.-made TrendSetter 3244 VFS, having a water-cooled 40 W infrared semiconductor laser loaded under a condition that output was 9 W, revolutionary speed of an outer surface drum was 210 rpm, printing plate energy was 100 mJ/cm$^2$ and resolution was 2400 dpi.

Thereafter, without any treatments, the plate was attached to a cylinder of each printing machine. After fountain solution was supplied, ink was supplied, and a paper was fed, carrying out printing. For all the presensitized plates of Examples, on-machine development was carried out without any problems, and so was printing.

1-3. Evaluation of Lithographic Printing Plates

The ink clean-up property and press life of the lithographic printing plate obtained above were evaluated.

(1) Ink Clean-Up Property

Printing was performed with IF2 type two-color sheet-fed press made by Mitsubishi Heavy Industries, Ltd. The printing was started with the normal printing conditions. After a good printed matter was obtained, a water supply to a printing plate was suspended by adjusting a water graduation and ink was adhered to the entire surface of the printing plate. Thereafter, ink clean-up property is evaluated by counting the number of lost papers generated from a time when a water amount supplied to a printing plate was returned to a normal level by again adjusting the water graduation until a good printed matter could be obtained. When ink clean-up property is good, the number of lost papers would become small and when ink clean-up property is poor, the number of lost papers would become large. Note that, here, ink clean-up property was used as one index of scum resistance.

The results were shown in Table 2.

(2) Press Life

Printing was performed in black ink of DIC-GEOS (N) made by Dainippon Ink And Chemicals, Incorporated with Lithrone Printing Machine made by Komori Corporation, and press life was evaluated by the number of the printed sheets at a time when a visual inspection recognizes that the density of a solid image begins to decrease. When press life is long, the number of the printed sheets would become large. When press life is short, the number would become small.

The results were shown in Table 2.

As is clear from Table 2, for the presensitized plate according to the present invention (Examples 1-1 to 1-26)

using the support for a lithographic printing plate according to the present invention in which an adhering amount of a rare-earth element atom to the surface is 0.1 to 20 mg/m$^2$, it is found that both ink clean-up property (scum resistance) and press life were excellent although an image recording layer contained an infrared absorbent.

On the other hand, when an adhering amount of a rare-earth element atom to the surface was 0 mg/m$^2$ (Comparative Examples 1-1 to 1-7), either ink clean-up property (scam resistance) or press life or both were poor.

TABLE 2

| | | Hydrophilic treatment | | | Treatment with liquid containing rare-earth element ion etc. | | | | | | | |
|---|---|---|---|---|---|---|---|---|---|---|---|---|
| | Graining treatment | Concentration of aqueous solution (wt %) | Liquid temperature (° C.) | Treatment time (sec.) | Kind of compound | Concentration of aqueous solution (g/L) | Liquid temperature (° C.) | Treatment time (sec.) | Adhering amount of rare-earth element (mg/m$^2$) | Image recording layer | Ink clean-up property (sheets) | Press life (10000 sheets) |
| Example 1-1 | Mechanical graining + Electrolysis with nitric acid | 1 | 20 | 10 | Cerium acetate | 1 | 60 | 10 | 7.5 | A | 20 | 5 |
| Example 1-2 | Mechanical graining + Electrolysis with nitric acid | 2.5 | 70 | 14 | Cerium acetate | 1 | 60 | 10 | 6.5 | A | 20 | 5 |
| Example 1-3 | Mechanical graining + Electrolysis with nitric acid | 0.6 | 30 | 30 | Cerium acetate | 1 | 60 | 10 | 5.2 | A | 20 | 5 |
| Example 1-4 | Mechanical graining + Electrolysis with nitric acid | 1 | 20 | 10 | Yttrium acetate | 1 | 60 | 10 | 6.5 | A | 20 | 5 |
| Example 1-5 | Mechanical graining + Electrolysis with nitric acid | 1 | 20 | 10 | Neodymium acetate | 1 | 60 | 10 | 8.5 | A | 22 | 5 |
| Example 1-6 | Mechanical graining + Electrolysis with nitric acid | 1 | 20 | 10 | Ytterbium acetate | 1 | 60 | 10 | 9.6 | A | 20 | 5 |
| Example 1-7 | Mechanical graining + Electrolysis with nitric acid | 1 | 20 | 10 | Praseodymium acetate | 1 | 60 | 10 | 6.6 | A | 18 | 5 |
| Example 1-8 | Mechanical graining + Electrolysis with nitric acid | 1 | 20 | 10 | Lanthanum acetate | 1 | 60 | 10 | 7.3 | A | 19 | 5 |
| Example 1-9 | Mechanical graining + Electrolysis with nitric acid | 1 | 20 | 10 | Cerium acetate/ sodium acetate | 0.5/0.1 | 20 | 10 | 2.5 | A | 21 | 5 |
| Example 1-10 | Mechanical graining + Electrolysis with nitric acid | 1 | 20 | 10 | Cerium acetate | 1 | 60 | 60 | 7.5 | A | 21 | 5 |
| Example 1-11 | Mechanical graining + Electrolysis with nitric acid | 1 | 20 | 10 | Cerium acetate | 0.01 | 20 | 10 | 0.10 | A | 20 | 4.5 |
| Example 1-12 | Mechanical graining + Electrolysis with nitric acid | 1 | 20 | 10 | Cerium acetate | 10 | 60 | 10 | 20.0 | A | 20 | 6.5 |

TABLE 2-continued

| | Graining treatment | Hydrophilic treatment: Concentration of aqueous solution (wt %) | Hydrophilic treatment: Liquid temperature (° C.) | Hydrophilic treatment: Treatment time (sec.) | Treatment with liquid containing rare-earth element ion etc.: Kind of compound | Treatment with liquid containing rare-earth element ion etc.: Concentration of aqueous solution (g/L) | Treatment with liquid containing rare-earth element ion etc.: Liquid temperature (° C.) | Treatment with liquid containing rare-earth element ion etc.: Treatment time (sec.) | Adhering amount of rare-earth element (mg/m²) | Image recording layer | Ink clean-up property (sheets) | Press life (10000 sheets) |
|---|---|---|---|---|---|---|---|---|---|---|---|---|
| Example 1-13 | Mechanical graining + Electrolysis with nitric acid | 1 | 20 | 10 | Cerium acetate | 1 | 20 | 10 | 5.0 | A | 20 | 5 |
| Example 1-14 | Mechanical graining + Electrolysis with nitric acid | 1 | 20 | 10 | Cerium nitrate | 1 | 20 | 10 | 1.7 | A | 20 | 5 |
| Example 1-15 | Mechanical graining + Electrolysis with nitric acid | 1 | 20 | 10 | Cerium (III) sulfate | 0.1 | 20 | 10 | 0.20 | A | 20 | 4.5 |
| Example 1-16 | Mechanical graining + Electrolysis with nitric acid | 1 | 20 | 10 | Cerium (IV) sulfate | 0.1 | 20 | 10 | 0.22 | A | 20 | 4.5 |
| Example 1-17 | Mechanical graining + Electrolysis with nitric acid | 1 | 20 | 10 | Cerium chloride | 0.1 | 20 | 10 | 1.6 | A | 20 | 4.5 |
| Example 1-18 | Mechanical graining + Electrolysis with nitric acid | 1 | 20 | 10 | Cerium carbonate | 0.1 | 20 | 10 | 0.23 | A | 20 | 4.5 |
| Example 1-19 | Mechanical graining + Electrolysis with nitric acid | 1 | 20 | 10 | Cerium hydroxide | 0.1 | 20 | 10 | 0.19 | A | 20 | 4.5 |
| Example 1-20 | Electrolysis with hydrochrolic acid | 1 | 20 | 10 | Cerium acetate | 1 | 20 | 10 | 5.0 | A | 20 | 5 |
| Example 1-21 | Mechanical graining + Electrolysis with nitric acid + Electrolysis with hydrochrolic acid | 1 | 20 | 10 | Cerium acetate | 1 | 20 | 10 | 5.0 | A | 18 | 6.5 |
| Example 1-22 | Mechanical graining + Electrolysis with nitric acid + Electrolysis with hydrochrolic acid | 1 | 20 | 10 | Yttrium acetate | 1 | 20 | 10 | 4.5 | A | 18 | 6.5 |
| Example 1-23 | Mechanical graining + Electrolysis with nitric acid + Electrolysis with hydrochrolic acid | 1 | 20 | 10 | Yttrium nitrate | 1 | 20 | 10 | 4.0 | A | 18 | 6.0 |
| Example 1-24 | Mechanical graining + Electrolysis with nitric | 1 | 20 | 10 | Cerium acetate | 1 | 20 | 10 | 5.0 | B | 20 | 3.0 |

TABLE 2-continued

| | | Hydrophilic treatment | | | Treatment with liquid containing rare-earth element ion etc. | | | | | | | |
|---|---|---|---|---|---|---|---|---|---|---|---|---|
| | Graining treatment | Concentration of aqueous solution (wt %) | Liquid temperature (° C.) | Treatment time (sec.) | Kind of compound | Concentration of aqueous solution (g/L) | Liquid temperature (° C.) | Treatment time (sec.) | Adhering amount of rare-earth element (mg/$m^2$) | Image recording layer | Ink clean-up property (sheets) | Press life (10000 sheets) |
| | acid + Electrolysis with hydrochrolic acid | | | | | | | | | | | |
| Example 1-25 | Mechanical graining + Electrolysis with nitric acid + Electrolysis with hydrochrolic acid | 1 | 20 | 10 | Cerium acetate | 1 | 20 | 30 | 6.2 | C | 20 | 4.0 |
| Example 1-26 | Mechanical graining + Electrolysis with nitric acid + Electrolysis with hydrochrolic acid | 2.5 | 70 | 14 | Cerium acetate | 1 | 20 | 10 | 5.5 | D | 21 | 2.0 |
| Comparative Example 1-1 | Mechanical graining + Electrolysis with nitric acid | 1 | 20 | 10 | Sodium acetate | 1 | 60 | 10 | 0 | A | 20 | 1.0 |
| Comparative Example 1-2 | Mechanical graining + Electrolysis with nitric acid | 1 | 20 | 10 | Calcium nitrite | 1 | 60 | 10 | 0 | A | 20 | 1.0 |
| Comparative Example 1-3 | Mechanical graining + Electrolysis with nitric acid | 1 | 20 | 10 | Cobalt acetate | 1 | 60 | 10 | 0 | A | 50 | 4.5 |
| Comparative Example 1-4 | Mechanical graining + Electrolysis with nitric acid | 1 | 20 | 10 | — | — | — | — | 0 | A | 20 | 0.7 |
| Comparative Example 1-5 | Mechanical graining + Electrolysis with nitric acid + Electrolysis with hydrochrolic acid | 1 | 20 | 10 | Cobalt acetate | 1 | 20 | 10 | 0 | B | 45 | 3.0 |
| Comparative Example 1-6 | Mechanical graining + Electrolysis with nitric acid + Electrolysis with hydrochrolic acid | 1 | 20 | 10 | Zirconyl chloride | 1 | 20 | 10 | 0 | C | 42 | 3.0 |

TABLE 2-continued

| | | Hydrophilic treatment | | | Treatment with liquid containing rare-earth element ion etc. | | | | | | | |
|---|---|---|---|---|---|---|---|---|---|---|---|---|
| | Graining treatment | Concentration of aqueous solution (wt %) | Liquid temperature (° C.) | Treatment time (sec.) | Kind of compound | Concentration of aqueous solution (g/L) | Liquid temperature (° C.) | Treatment time (sec.) | Adhering amount of rare-earth element ($mg/m^2$) | Image recording layer | Ink clean-up property (sheets) | Press life (10000 sheets) |
| Comparative Example 1-7 | Mechanical graining + Electrolysis with nitric acid + Electrolysis with hydrochrolic acid | 1 | 20 | 10 | — | — | — | — | 0 | D | 21 | 0.5 |

<Example of the Second Aspect According to the Present Invention>

2-1. Preparation of Presensitized Plates

Example 2-1

A presensitized plate was obtained with the same method as in Example 1-1, except that (i-2) mentioned below was performed in place of (i-1) mentioned above.

(i-2) Treatment with Aqueous Solution Containing Carboxylic Acid and/or Carboxylate of Element in the 3rd to the 7th Groups and the 13th to the 16th Groups of the Periodic Table Treatment with aqueous solution containing carboxylic acid and/or carboxylate of element in the 3rd to the 7th groups and the 13th to the 16th groups of the periodic table was carried out by dipping the aluminum plate into a treatment cell with the aqueous solution containing 0.1 wt % of acetic acid at a temperature of 60° C. for 10 seconds. Then, the plate was washed by water spraying using well water. In this way, a support for a lithographic printing plate was obtained.

Examples 2-2 to 2-7 and Comparative Examples 2-1 and 2-2

Presensitized plates were obtained with the same methods as in Example 2-1, except that the concentration of the aqueous solution, the temperature of the aqueous solution and the dipping time in (h) mentioned above, and the kind of the solute of the aqueous solution, the concentration of the aqueous solution, the temperature of the aqueous solution and the dipping time in (i-2) mentioned above were changed as shown in Table 3.

Note that, "-" in Table 3 indicates that no treatment was performed.

Examples 2-8

A presensitized plate was obtained with the same methods as in Example 2-1, except that (m), (n) and (o) mentioned below were performed between (f) and (g) mentioned above.

Example 2-9

A presensitized plate was obtained with the same method as in Example 2-1, except that (a) mentioned above was not performed and (j), (k) and (l) mentioned above were performed in place of (d), (e) and (f) mentioned above.

Examples 2-10 to 2-13 and Comparative Examples 2-3 and 2-4

Presensitized plates were obtained with the same methods as in Example 2-9, except that the concentration of the aqueous solution, the temperature of the aqueous solution and the dipping time in (h) mentioned above, and the kind of the solute of the aqueous solution and the concentration of the aqueous solution in (i-2) mentioned above were changed as shown in Table 3.

Note that, "-" in Table 3 indicates that no treatment was performed.

2-2. Exposure and Development Treatment

Image exposure and development treatment were performed on each presensitized plate obtained above with the same methods as described in "(1) In a case of thermal positive type image recording layer A" of "1-2. Exposure and development treatment", except that a development temperature was set at 30° C. and a lithographic printing plate was obtained.

2-3. Evaluation of Lithographic Printing Plates

The ink clean-up property and press life of a lithographic printing plate obtained above were evaluated with the method as described in "1-3. Evaluation of lithographic printing plates". The results are shown in Table 3.

As is clear from Table 3, it is found that for the presensitized plate according to the present invention (Examples 2-1 to 2-13) using the support for a lithographic printing plate according to the present invention obtainable by performing hydrophilic treatment on an aluminum plate with an alkali metal silicate aqueous solution with the concentration of 0.6 to 5.0 wt % after performing graining treatment and anodizing treatment thereon and further performing a treatment with an aqueous solution containing a carboxylic acid and/or a carboxylate of an element in the 3rd to the 7th groups and the 13th to the 16th groups of the periodic table, both ink clean-up property (scum resistance) and press life thereof were excellent.

On the other hand, when the concentration of an alkali metal silicate aqueous solution used in hydrophilic treatment was too low (Comparative Examples 2-1 and 2-3), the effect of hydrophilic treatment was low and ink clean-up property (scum resistance) was poor. Moreover, when a treatment with an aqueous solution containing a carboxylic acid and/or a carboxylate of an element in the 3rd to the 7th groups and the 13th to the 16th groups of the periodic table was not performed (Comparative Examples 2-2 and 2-4), press life was inferior.

TABLE 3

| | Graining treatment | Hydrophilic treatment: Concentration of aqueous solution (wt %) | Hydrophilic treatment: Liquid temperature (° C.) | Hydrophilic treatment: Treatment time (sec.) | Treatment with aqueous solution containing carboxylic acid and/or carboxylate: Kind of carboxylic acid and/or carboxylate | Treatment with aqueous solution containing carboxylic acid and/or carboxylate: Concentration of aqueous solution (wt %) | Treatment with aqueous solution containing carboxylic acid and/or carboxylate: Liquid temperature (° C.) | Treatment with aqueous solution containing carboxylic acid and/or carboxylate: Treatment time (sec.) | Ink clean-up property (sheets) | Press Life (10000 sheets) |
|---|---|---|---|---|---|---|---|---|---|---|
| Example 2-1 | Mechanical graining + Electrolysis with nitric acid | 1 | 20 | 10 | Acetic acid | 0.1 | 60 | 10 | 20 | 5.0 |
| Example 2-2 | Mechanical graining + Electrolysis with nitric acid | 1 | 20 | 10 | Oxalic acid | 0.1 | 60 | 30 | 19 | 4.9 |
| Example 2-3 | Mechanical graining + Electrolysis with nitric acid | 0.6 | 30 | 30 | Lithium lactate | 0.1 | 60 | 10 | 20 | 5.2 |
| Example 2-4 | Mechanical graining + Electrolysis with nitric acid | 2.5 | 70 | 14 | Alanine potassium salt | 0.1 | 60 | 10 | 18 | 4.9 |
| Example 2-5 | Mechanical graining + Electrolysis with nitric acid | 1 | 20 | 10 | Diammonium phthalate | 0.1 | 60 | 10 | 20 | 4.8 |
| Example 2-6 | Mechanical graining + Electrolysis with nitric acid | 1 | 20 | 10 | Malic acid | 1 | 60 | 10 | 20 | 5.0 |
| Example 2-7 | Mechanical graining + Electrolysis with nitric acid | 1 | 20 | 10 | Succinic acid | 0.1 | 60 | 10 | 20 | 5.1 |
| Example 2-8 | Mechanical graining + Electrolysis with nitric acid + Electrolysis with hydrochrolic acid | 1 | 20 | 10 | Acetic acid | 0.1 | 60 | 10 | 18 | 5.3 |
| Comparative Example 2-1 | Mechanical graining + Electrolysis with nitric acid | 0.2 | 30 | 30 | Acetic acid | 0.1 | 60 | 10 | 50 | 5.0 |
| Comparative Example 2-2 | Mechanical graining + Electrolysis with nitric acid | 1 | 20 | 10 | — | — | — | — | 20 | 1.0 |
| Example 2-9 | Electrolysis with hydrochrolic acid | 1 | 20 | 10 | Andouronic acid | 0.1 | 60 | 10 | 20 | 4.5 |
| Example 2-10 | Electrolysis with hydrochrolic acid | 4.5 | 30 | 30 | Zirconium picolinate | 0.1 | 60 | 10 | 19 | 4.3 |
| Example 2-11 | Electrolysis with hydrochrolic acid | 2.5 | 70 | 14 | Triethylamine sorbate | 0.2 | 60 | 10 | 20 | 4.7 |
| Example 2-12 | Electrolysis with hydrochrolic acid | 1 | 20 | 10 | Glycolic acid | 0.1 | 60 | 10 | 20 | 4.7 |

TABLE 3-continued

| | Graining treatment | Hydrophilic treatment: Concentration of aqueous solution (wt %) | Liquid temperature (° C.) | Treatment time (sec.) | Treatment with aqueous solution containing carboxylic acid and/or carboxylate: Kind of carboxylic acid and/or carboxylate | Concentration of aqueous solution (wt %) | Liquid temperature (° C.) | Treatment time (sec.) | Ink clean-up property (sheets) | Press Life (10000 sheets) |
|---|---|---|---|---|---|---|---|---|---|---|
| Example 2-13 | Electrolysis with hydrochrolic acid | 1 | 20 | 10 | Cystein pyridinium | 0.2 | 60 | 10 | 20 | 4.5 |
| Comparative Example 2-3 | Electrolysis with hydrochrolic acid | 0.2 | 30 | 30 | Acetic acid | 0.1 | 60 | 10 | 45 | 4.5 |
| Comparative Example 2-4 | Electrolysis with hydrochrolic acid | 1 | 20 | 10 | — | — | — | — | 20 | 0.8 |

This application claims priority on Japanese patent applications No.2002-86457 and No.2002-94335, the contents of which are hereby incorporated by reference. In addition, the contents of literatures cited herein are incorporated by reference.

What is claimed is:

1. A presensitized plate provided with an image recording layer on a support for a lithographic printing plate, wherein an adhering amount of a rare-earth element atom to a surface of the support is 0.1 to 20 $mg/m^2$, and the image recording layer is an image recording layer containing an infrared absorbent.

2. The presensitized plate according to claim 1, wherein the support is obtainable by sequentially performing a hydrophilic treatment and a treatment with a liquid containing a rare-earth element ion on an aluminum plate after at least an anodizing treatment is performed thereon.

3. The presensitized plate according to claim 2, wherein the hydrophilic treatment is a treatment with an alkali metal silicate aqueous solution.

4. A presensitized plate provided with an image recording layer on a support for a lithographic printing plate, wherein an adhering amount of a rare-earth element atom to a surface of the support is 0.1 to 20 $mg/m^2$, and there is provided an intermediate layer containing a high-molecular compound having a constituent with an acid group and a constituent with an onium group between the support and the image recording layer.

5. The presensitized plate according to claim 4, wherein the support is obtainable by sequentially performing a hydrophilic treatment and a treatment with a liquid containing a rare-earth element ion on an aluminum plate after at least an anodizing treatment is performed thereon.

6. The presensitized plate according to claim 5, wherein the hydrophilic treatment is a treatment with an alkali metal silicate aqueous solution.

7. A presensitized plate according to claim 1, wherein there is provided an intermediate layer containing a high-molecular compound having a constituent with an acid group and a constituent with an onium group between the support and the image recording layer.

8. A presensitized plate according to claim 7, wherein the support is obtainable by sequentially performing a hydrophilic treatment and a treatment with a liquid containing a rare-earth element ion on an aluminum plate after at least an anodizing treatment is performed thereon.

9. A presensitized plate according to claim 8, wherein the hydrophilic treatment is a treatment with an alkali metal silicate aqueous solution.

10. A method for producing a lithographic printing plate by performing a development using a developer containing substantially no alkali metal silicates after an exposure is performed on the presensitized plate according to claim 1 to obtain a lithographic printing plate.

11. A method for producing a lithographic printing plate by performing a development using a developer containing substantially no alkali metal silicates after an exposure is performed on the presensitized plate according to claim 2 to obtain a lithographic printing plate.

12. A method for producing a lithographic printing plate by performing a development using a developer containing substantially no alkali metal silicates after an exposure is performed on the presensitized plate according to claim 3 to obtain a lithographic printing plate.

13. A method for producing a lithographic printing plate by performing a development using a developer containing substantially no alkali metal silicates after an exposure is performed on the presensitized plate according to claim 4 to obtain a lithographic printing plate.

14. A method for producing a lithographic printing plate by performing a development using a developer containing substantially no alkali metal silicates after an exposure is performed on the presensitized plate according to claim 5 to obtain a lithographic printing plate.

15. A method for producing a lithographic printing plate by performing a development using a developer containing substantially no alkali metal silicates after an exposure is performed on the presensitized plate according to claim 6 to obtain a lithographic printing plate.

16. A method for producing a lithographic printing plate by performing a development using a developer containing substantially no alkali metal silicates after an exposure is performed on the presensitized plate according to claim 7 to obtain a lithographic printing plate.

17. A method for producing a lithographic printing plate by performing a development using a developer containing substantially no alkali metal silicates after an exposure is performed on the presensitized plate according to claim 8 to obtain a lithographic printing plate.

18. A method for producing a lithographic printing plate by performing a development using a developer containing substantially no alkali metal silicates after an exposure is performed on the presensitized plate according to claim 9 to obtain a lithographic printing plate.

* * * * *